US010887523B2

(12) United States Patent
Osada et al.

(10) Patent No.: US 10,887,523 B2
(45) Date of Patent: Jan. 5, 2021

(54) ELECTRONIC APPARATUS

(71) Applicant: CANON KABUSHIKI KAISHA, Tokyo (JP)

(72) Inventors: Yoichi Osada, Yokohama (JP); Hidetoshi Kei, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/562,316

(22) Filed: Sep. 5, 2019

(65) Prior Publication Data

US 2019/0394403 A1 Dec. 26, 2019

Related U.S. Application Data

(63) Continuation of application No. PCT/JP2018/006461, filed on Feb. 22, 2018.

(30) Foreign Application Priority Data

Mar. 6, 2017 (JP) .................................. 2017-041194
Feb. 21, 2018 (JP) .................................. 2018-029208

(51) Int. Cl.
*H04N 5/232* (2006.01)
*H05K 5/02* (2006.01)
*H05K 5/00* (2006.01)

(52) U.S. Cl.
CPC ....... *H04N 5/23293* (2013.01); *H05K 5/0017* (2013.01); *H05K 5/0226* (2013.01)

(58) Field of Classification Search
CPC ............. H04N 5/2251; H04N 5/23293; H05K 5/0017; H05K 5/0226
See application file for complete search history.

(56) References Cited

U.S. PATENT DOCUMENTS 5,740,480 A * 4/1998 Kuhn, Jr. ................ G03B 17/04
                                                        348/64
6,393,222 B1 * 5/2002 Nakagawa ......... H04N 5/23241
                                                        348/333.06
(Continued)

FOREIGN PATENT DOCUMENTS

CN         1238629 A      12/1999
CN       101086597 A      12/2007
(Continued)

OTHER PUBLICATIONS

The International Search Report of the corresponding International Application, PCT/JP2018/006461 dated Apr. 3, 2018.
(Continued)

*Primary Examiner* — Amy R Hsu
(74) *Attorney, Agent, or Firm* — Cowan, Liebowitz & Latman, P.C.

(57) ABSTRACT

An electronic apparatus includes a main unit, a first display unit, and a second display unit. The first display unit is slidable with respect to the main body unit. When the main body unit and the first display unit are overlapped, the main body unit houses the second display unit in an area where the main body unit and the first display unit are overlapped. The second display unit moves to an area where the first display unit is not existed by a slide of the first display unit with respect to the main body unit and protrudes from an inside of the main body unit.

18 Claims, 19 Drawing Sheets

(56) References Cited

U.S. PATENT DOCUMENTS

| | | | | |
|---|---|---|---|---|
| 7,133,608 | B1* | 11/2006 | Nagata | G03B 13/02 396/374 |
| 8,432,485 | B1* | 4/2013 | Martinez | G03B 17/04 348/373 |
| 9,586,532 | B1* | 3/2017 | Gough | E05F 1/1215 |
| 2009/0168369 | A1* | 7/2009 | Barnett | H05K 5/0226 361/727 |
| 2013/0120629 | A1* | 5/2013 | Kim | H04N 5/23216 348/333.01 |
| 2014/0139987 | A1* | 5/2014 | Onda | H04M 1/0216 361/679.02 |
| 2014/0176775 | A1* | 6/2014 | Ichikawa | H04N 5/2624 348/333.05 |
| 2018/0210316 | A1* | 7/2018 | Inaba | G03B 17/04 |

FOREIGN PATENT DOCUMENTS

| | | | |
|---|---|---|---|
| JP | H10-222090 A | | 8/1998 |
| JP | 2001-128035 A | | 5/2001 |
| JP | 2001-280979 A | | 10/2001 |
| JP | 2004-120490 A | | 4/2004 |
| JP | 2004-304459 | | 10/2004 |
| JP | 2009-265324 A | | 11/2009 |
| JP | 2009265324 A | * | 11/2009 |
| JP | 2011-097312 A | | 5/2011 |
| JP | 2014-045314 A | | 3/2014 |
| JP | 2015-144361 A | | 8/2015 |
| JP | 2015-204568 A | | 11/2015 |
| KR | 10-2013-0053040 A | | 5/2013 |

OTHER PUBLICATIONS

A Japanese Office Action of the corresponding Japanese Application, JP2018-029208 dated May 28, 2019, with a translation.
PCT/IB/338 (PCT Notification of Transmittal of Translation of the International Preliminary Report on Patentability).
PCT/IB/373 (PCT International Preliminary Report on Patentability).
PCT/ISA/237 (PCT Written Opinion of the International Searching Authority).
The above patent documents were cited in the Jun. 11, 2020 Korean Office Action, which is enclosed with an English Translation, that issued in Korean Patent Application No. 10-2019-7024460.
The above foreign patent document was cited in a Jul. 23, 2020 Chinese Office Action, a copy of which is enclosed with an English Translation, that issued in Chinese Patent Application No. 201880015731.X.

* cited by examiner

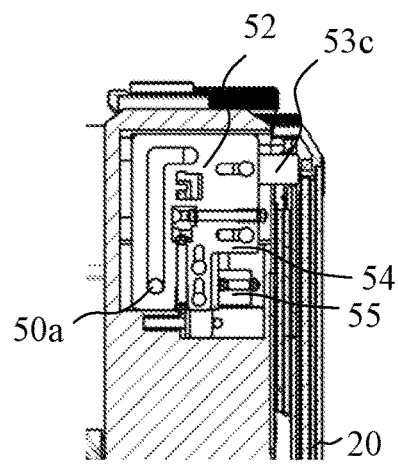
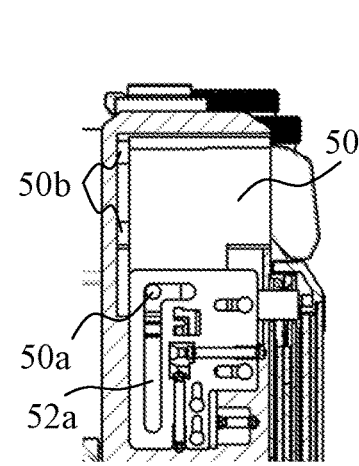
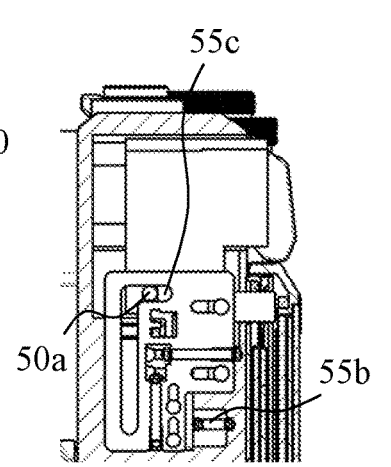
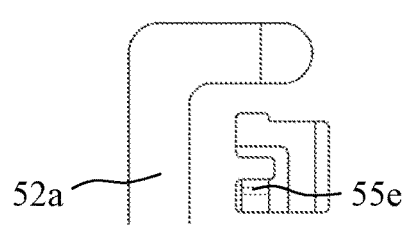
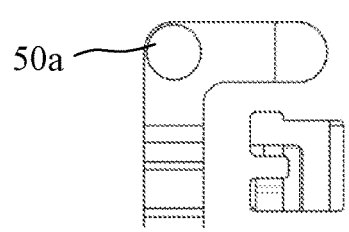
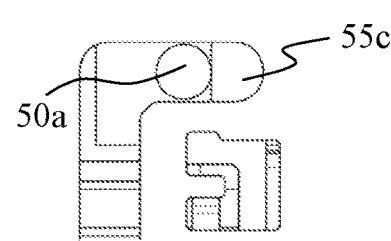
FIG. 7A   FIG. 7B   FIG. 7C
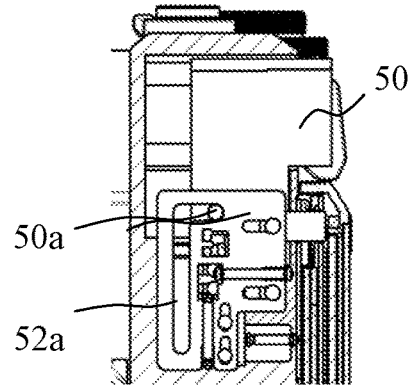
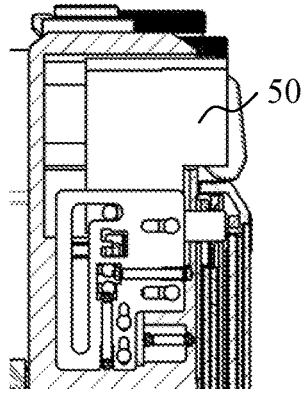
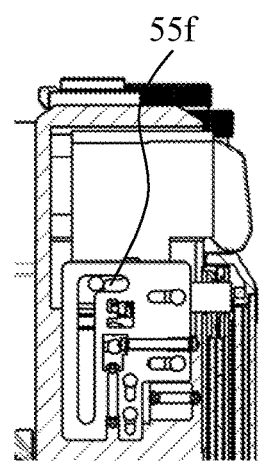
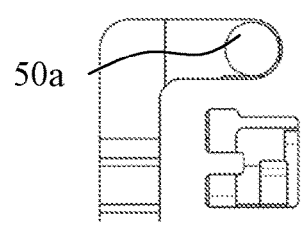
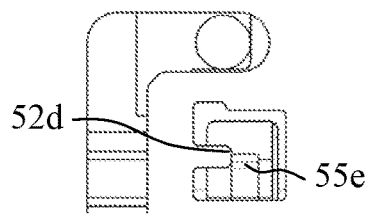
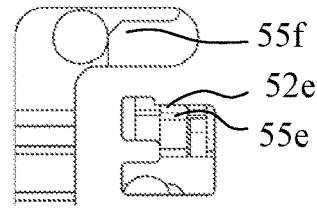
FIG. 7D   FIG. 7E   FIG. 7F

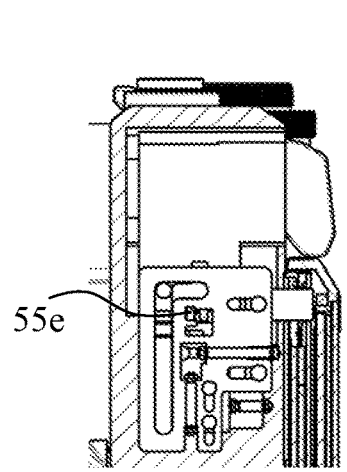 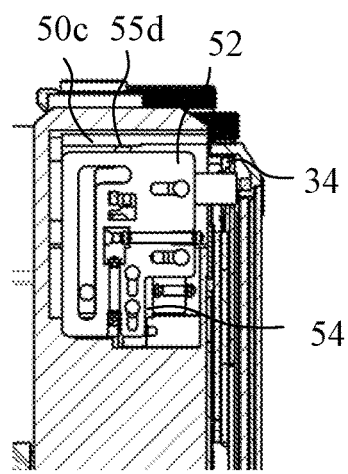 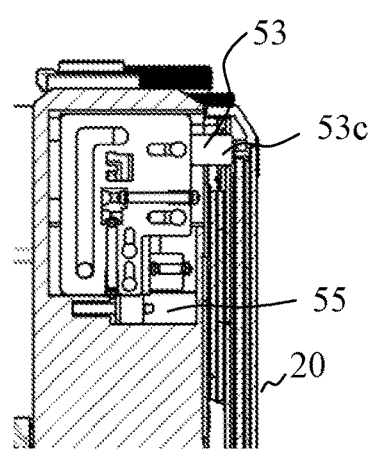
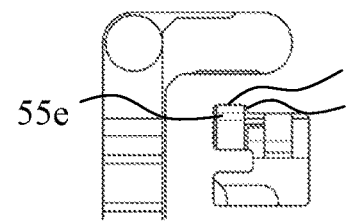 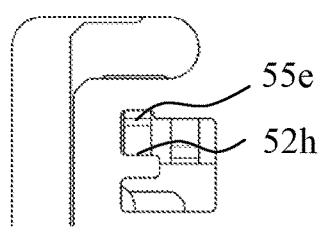 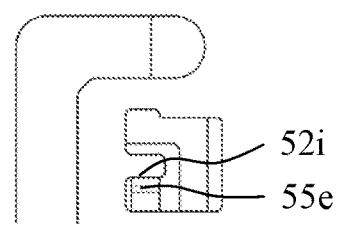
FIG. 7G     FIG. 7H     FIG. 7I

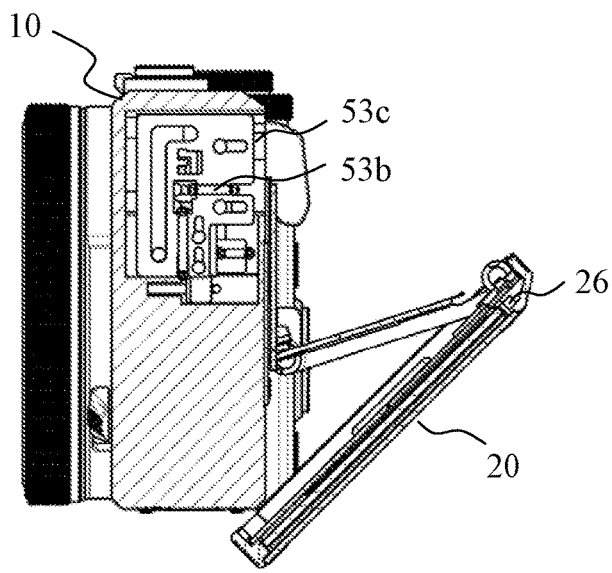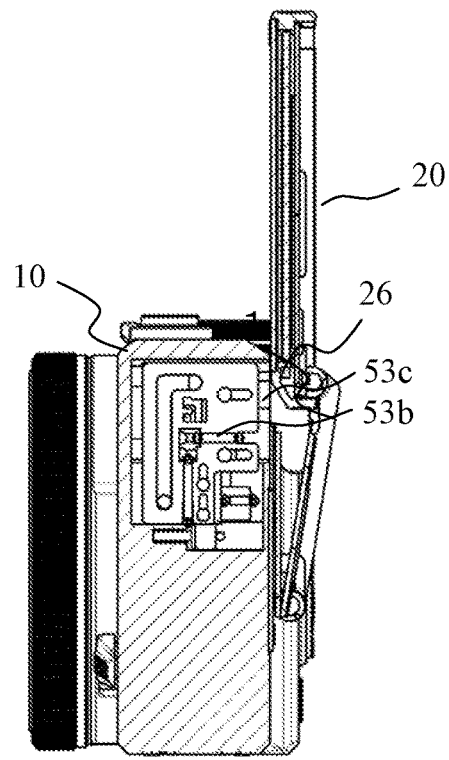
FIG. 8A  FIG. 8B
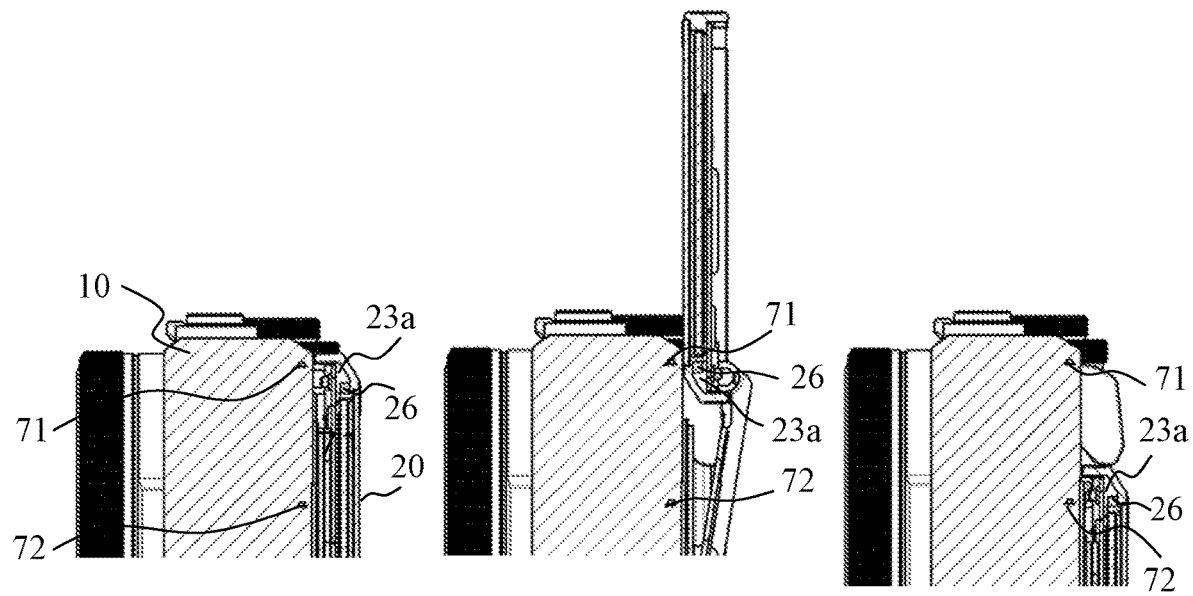
FIG. 9A  FIG. 9B  FIG. 9C

ELECTRONIC APPARATUS

CROSS-REFERENCE TO RELATED APPLICATIONS

This application is a Continuation of International Patent Application No. PCT/JP2018/006461, filed Feb. 22, 2018, which claims the benefit of Japanese Patent Applications Nos. 2017-041194, filed on Mar. 6, 2017, and 2018-029208, filed Feb. 21, 2018, all of which are hereby incorporated by reference herein in their entirety.

BACKGROUND OF THE INVENTION

Field of the Invention

The present invention relates to an electronic apparatus.

Description of the Related Art

Japanese Patent Laid-Open No. ("JP") 2001-128035 discloses a digital camera that exposes an electronic viewfinder to be usable by sliding a display apparatus with respect to a main body.

An electronic viewfinder, which is housed in an apparatus body when not in use and protrudes from the apparatus body when in use, has been known. However, JP 2001-128035 fails to disclose the electronic viewfinder that protrudes when in use. In addition, JP 2001-128035 fails to disclose the display apparatus that tilts after the slide. If, in the configuration disclosed in Patent Literature 1, the display apparatus tilts while the electronic viewfinder protrudes, the display apparatus and the electronic viewfinder may interfere.

SUMMARY OF THE INVENTION

With the foregoing problems in mind, it is an object of the present invention to provide an electronic apparatus capable of suppressing interference between a display apparatus and an electronic viewfinder due to a tilt of the display apparatus.

An electronic apparatus according to one aspect of the present invention includes a main unit, a first display unit, and a second display unit. The first display unit is slidable with respect to the main body unit. When the main body unit and the first display unit are overlapped, the main body unit houses the second display unit in an area where the main body unit and the first display unit are overlapped. The second display unit moves to an area where the first display unit is not existed by a slide of the first display unit with respect to the main body unit and protrudes from an inside of the main body unit.

Further features of the present invention will become apparent from the following description of exemplary embodiments with reference to the attached drawings.

BRIEF DESCRIPTION OF THE DRAWINGS

FIGS. 7A to 7I are explanatory diagrams of an operation of the electronic viewfinder (Embodiment 1).

FIGS. 8A and 8B are explanatory diagrams of a behavior of a lever when the display apparatus tilts (Embodiment 1).

FIGS. 9A to 9C are explanatory diagrams of a display switching method of the display apparatus when the display apparatus operates (Embodiment 1).

DESCRIPTION OF THE EMBODIMENTS

Figure 1A:
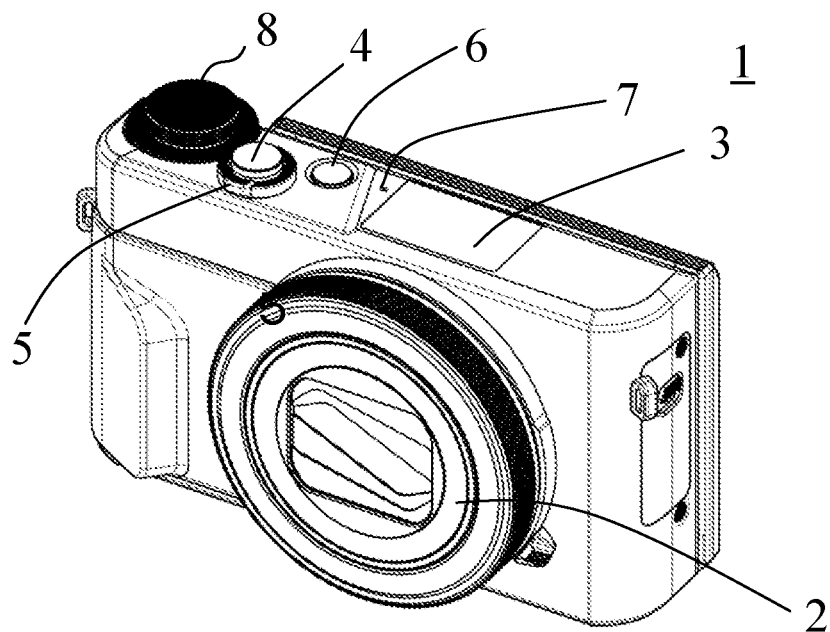
FIGS. 1A and 1B are perspective views of an imaging apparatus, which is an example of an electronic apparatus according to an embodiment of the present invention.

Referring now to the accompanying drawings, a description will be given of embodiments according to the present invention. In each figure, corresponding elements will be designated by the same reference numerals, and a duplicate description thereof will be omitted.

Figure 1B:
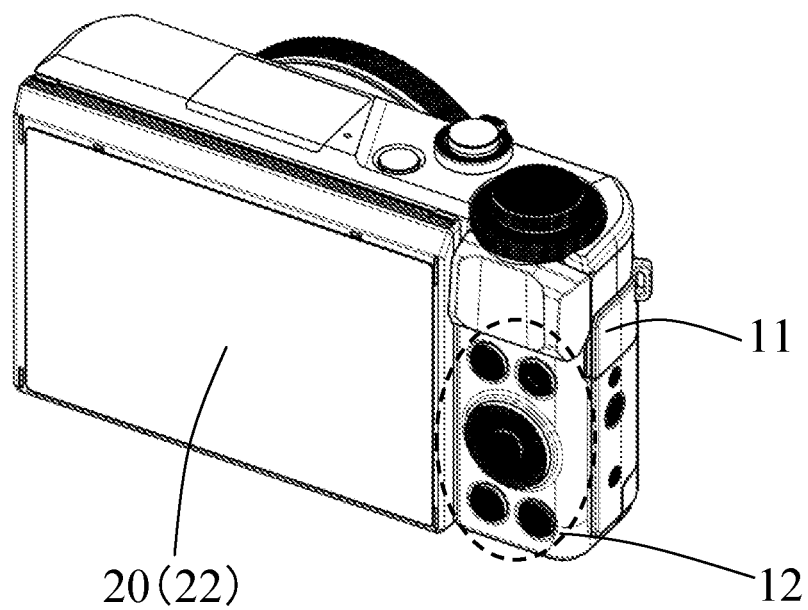

Referring to FIGS. 1A and 1B, a description will be given of a configuration of an imaging apparatus 1, which is an example of an electronic apparatus according to an embodiment of the present invention. FIGS. 1A and 1B are perspective views of the imaging apparatus 1. FIGS. 1A and 1B are respectively a front perspective view and a rear perspective view of the imaging apparatus 1.

The imaging apparatus 1 includes a barrel unit 2 having an imaging optical system (not illustrated) and an image sensor (not illustrated), such as a CCD and a CMOS, that photoelectrically converts an optical image of an object imaged through an imaging optical system to generate image data. The barrel unit 2 is a collapsible lens barrel, and is collapsed inside the imaging apparatus 1 when housed. In addition, on the imaging apparatus 1, a main substrate (not illustrated) including a processing circuit for converting the image data generated by the imaging sensor into digital information and an auxiliary substrate (not illustrated) are mounted.

A flash apparatus 3 is incorporated in the imaging apparatus 1, and when brightness of the object is insufficient at the time of shooting, rises automatically to expose a light emitting window and emits light.

A release button 4 can perform two-step pressing operations in a half-pressed state (SW1 is on) and a full-press state (SW2 is on). When the release button 4 is half-pressed, a photographing preparation operation (photometric operation and focus detection operation) starts. When the release button 4 is full-pressed, the object is photographed, and image data of an object image is recorded on a recording medium (not illustrated).

A zoom lever 5 is rotatably held on an outer periphery of the release button 4. When the zoom lever 5 is rotated in one direction, a zoom operation to a Tele side (direction where a field angle becomes narrower) is performed, and when the zoom lever 5 is rotated in the other direction, a zoom operation to a Wide side (direction where a field angle becomes wider) is performed.

When a power button 6 is depressed by a photographer, the imaging apparatus 1 is switched from an ON state which is an unused state to an OFF state which is an used state, or from the OFF state to the ON state.

A microphone hole 7 is provided above the imaging apparatus 1 to be taken in voice by a microphone built into the imaging apparatus 1 in consideration of sound collection performance.

A mode setting dial 8 is rotatably supported relative to the imaging apparatus 1. A plurality of icons according to various shooting modes is printed on a top surface of the mode setting dial 8, and the mode according to each icon can be set by aligning the icon with a mark provided on the imaging apparatus 1.

Further, the imaging apparatus 1 incorporates a main battery (not illustrated) as a power source and a recording medium (not illustrate) for recording the photographed object image. The main battery may be a disposable primary battery or a rechargeable secondary battery.

The side of the imaging apparatus 1 is provided with an input and output jack (not illustrated) for a power supply and a signal, and is covered with a jack cover 11 to protect the jack. When the jack cover 11 is opened, the input and output jack is exposed to enable removing/inserting of various cables.

An operation button group 12 is composed of a plurality of operation buttons, and a cross button is disposed at the center. Each operation button of the operation button group 12 is used when inputting various instructions such as change of photographing conditions and switching to a reproduction screen.

A display apparatus (first display unit) 20 is provided on a back of the imaging apparatus 1, and is used to check the object image to be photographed and to reproduce and display the captured image. As the display apparatus 20, for example, a liquid crystal display 22 is used. The display apparatus 20 is attached to the imaging apparatus body (main body unit) through a hinge apparatus (coupling unit) 30 to enable a sliding operation and tilt operation.

Embodiment 1

Referring to FIGS. 2A to 2D, a description will be given of an operation of the display apparatus. FIGS. 2A to 2D are explanatory diagrams of the operation of the display apparatus 20.

Figure 2A:
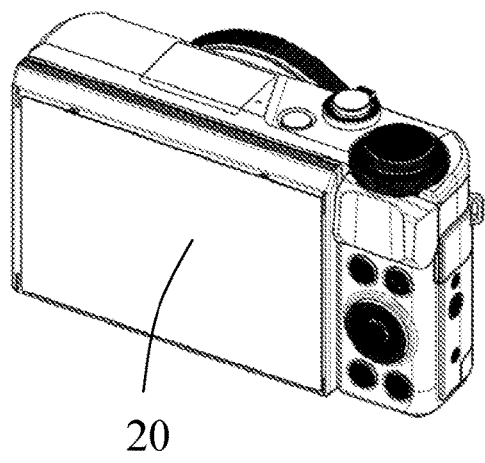
FIGS. 2A to 2D are explanatory diagrams of an operation of a display apparatus (Embodiment 1).

FIG. 2A illustrates a state in which the display apparatus 20 is housed in the imaging apparatus 1. In this state, a photographer can shoot an object in front, and reproduce and display the photographed image.

Figure 2B:
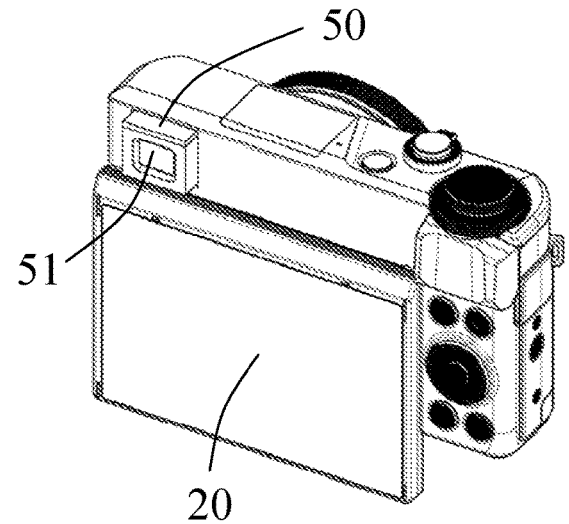

FIG. 2B illustrates a state in which the display apparatus 20 slides downward. In this state, a photographer can use an electronic viewfinder (second display unit) 50. Sliding the display apparatus 20 downward moves the electronic viewfinder 50 to an area in which the display apparatus 20 is not existed, and thereby the electronic viewfinder 50 protrudes from a housing position in which the electronic viewfinder 50 is housed in the imaging apparatus 1 to a position (use position) in which the electronic viewfinder 50 is usable. The electronic viewfinder 50 includes a small display, a lens, and an eyepiece window 51. A photographer looks into the electronic viewfinder 50 through the eyepiece window 51 to confirm the object image to be photographed or the photographed image.

Figure 2C:
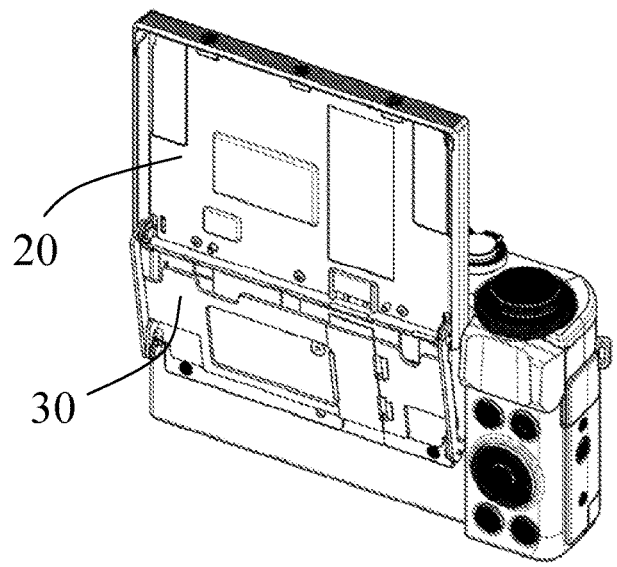

FIG. 2C illustrates a state in which the display apparatus 20 tilts by 180 degrees upward. In this state, a display surface of the display apparatus 20 is directed to an object side to enable the photographer to easily perform self-shooting. The display apparatus 20 is adjusted to be an arbitrary angle between the state of FIG. 2A and the state of FIG. 2C with respect to the imaging apparatus body. Such adjustment is mainly performed when a photographer holds the imaging apparatus 1 low to shoot an object.

Figure 2D:
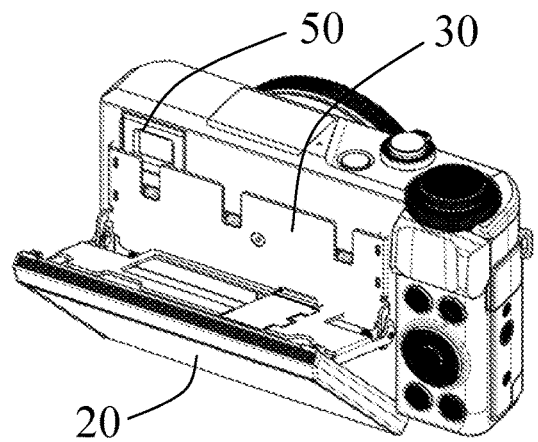

FIG. 2D illustrates a state in which the display apparatus 20 tilts by 45 degrees downward. This state is mainly used when a photographer holds the imaging apparatus 1 high to shoot.

As described above, even when the position of the imaging apparatus 1 with respect to a photographer changes, tilting the display apparatus 20 can direct the display surface of the display apparatus 20 toward a photographer, and a photographer can view the display apparatus 20 in an optimal state.

Figure 3:
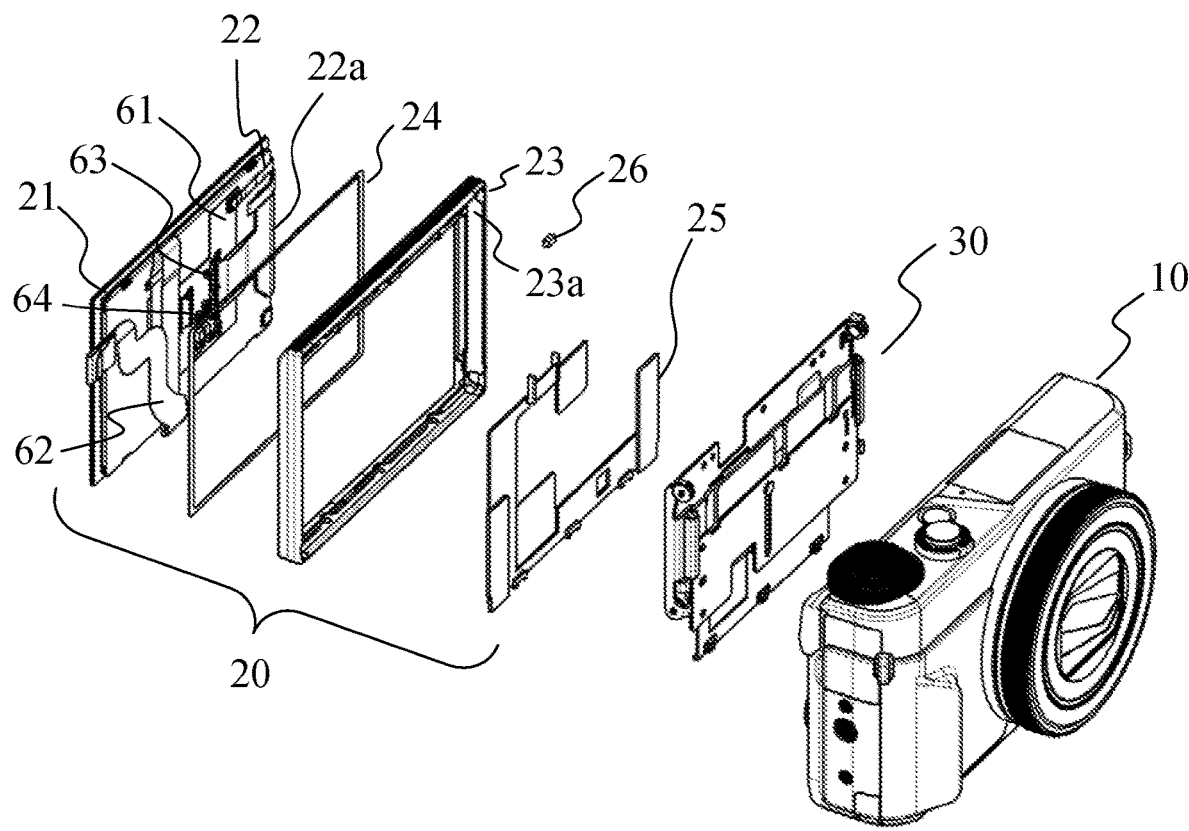
FIG. 3 is an exploded perspective view of the display apparatus (Embodiment 1).

Next, referring to FIG. 3, a description will be given of a configuration of the display apparatus 20. FIG. 3 is an exploded perspective view of the display apparatus 20. In FIG. 3, the imaging apparatus body 10 and the hinge apparatus 30 are also illustrated for the sake of clarity.

The display apparatus 20 includes a protective window 21, an electrostatic capacitance touch panel (not illustrated) for performing an input operation by contact by a photographer, a liquid crystal display 22, and a protective cover (protector) 23.

The protective window 21 is a panel whose outer shape is larger than an outer shape of the liquid crystal display 22 and which protects the liquid crystal display 22 and the touch panel from scratches and dirt. In this embodiment, as the protective window 21, strengthened glass having a thickness of about 0.5 to 1.0 mm is used, but a transparent resin, such as an acrylic resin or a polycarbonate, having high light transmittance may be used.

The protective window 21 is adhered to the protective cover 23 integrally with the touch panel and the liquid crystal display 22 by a square-shaped double-sided tape 24 formed along the outer periphery of the protective window 21. The protective cover 23 is an outside appearance member that covers the periphery of the display apparatus 20 to protect the display apparatus 20. The surface of the protective cover 23 is subjected to painting or embossing. Adhesive strength of the double-sided tape 24 is preferably high and resistant to an impact to prevent floating and cracking due to peeling of the protective window 21 by an impact, such as falling.

The touch panel is a capacitive type, and the wiring of the touch panel is formed of an ITO (Indium Tin Oxide) which is a transparent conductive film. The touch panel is generally formed of a glass, but may be formed of a resin material which is transparent and can withstand temperatures such as annealing of the ITO. As a transparent resin material, for example, an acrylic resin or a polycarbonate resin can be used.

A substrate 61 is attached a back of the liquid crystal display 22 by a double-sided tape (not illustrated). The substrate 61 is connected to a flexible printed substrate 22a provided in the liquid crystal display 22 through a connector 63 mounted on the substrate 61.

A flexible printed substrate 62 has a first end that is connected to the substrate 61 through a connector 64 mounted on the substrate 61, and a second end that is connected to the main substrate provided inside the imaging apparatus 1 (not illustrated). With this configuration, an electrical signal from the main substrate is transmitted to the display apparatus 20.

A spacer 25 is formed by a molding resin member, and is assembled to the protective cover 23 from a direction opposite to an assembling direction of the protective window 21. The spacer 25 is sandwiched between the protective cover 23 and the hinge apparatus 30, and is fixed to close a gap between the protective cover 23 and the hinge apparatus 30.

A magnet (magnetic field generator) 26 is housed in a concave part 23a formed in the protective cover 23, and is adhered and fixed to the concave part 23a. When a magnetic sensor described later detects a magnetic flux that varies with a position of the magnet 26, switching of ON/OFF of display and a display direction of the display apparatus 20 is executed. As the magnetic sensor to detect the magnetic flux, a giant magnet resistance (GMR) element or a semiconductor hall element is generally used. The GMR element is a device that detects the magnetic flux parallel to a main surface by using the magnet resistive effect, and is made from an alloy (specifically, the main components of which are nickel, iron, and cobalt) having a property that electrical resistance increases as the magnetic flux becomes stronger. Assembling the GMR element to a determination circuit forms a GMR sensor. In this embodiment, the GMR sensor detects the magnetic flux that varies with the position of the magnet 26 to switch the display of the display apparatus 20.

Figure 4A:
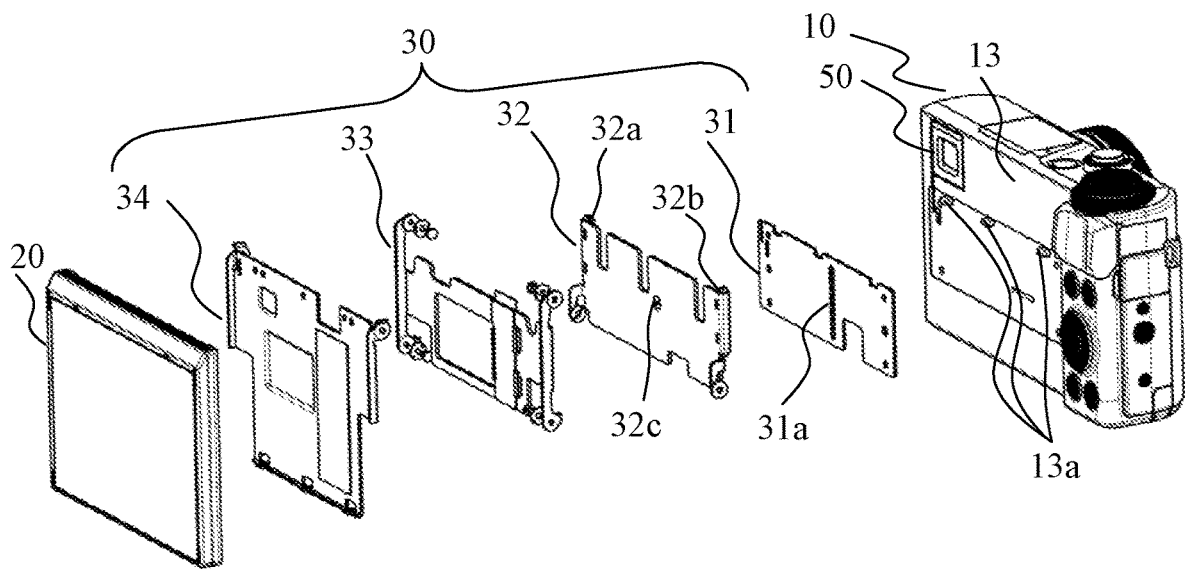
FIGS. 4A and 4B are explanatory diagrams of a hinge device s (Embodiment 1).
Figure 4B:
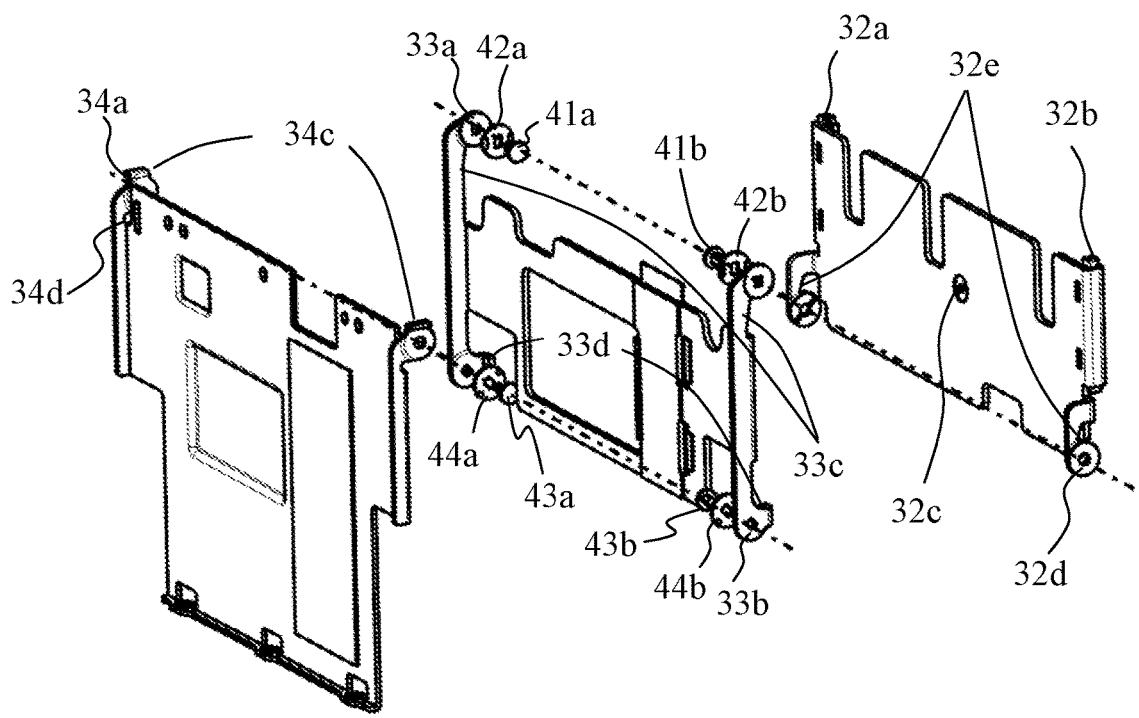

Next, referring to FIGS. 4A and 4B, a description will be given of a configuration of the hinge apparatus 30. FIGS. 4A and 4B are explanatory diagrams of the hinge apparatus 30. In FIG. 4A, the imaging apparatus body 10 and the display apparatus 20 are also illustrated to make the explanation easy to understand. FIG. 4B is an enlarged view of a part of the hinge apparatus 30.

The hinge apparatus 30 includes a fixed plate 31, a slide plate 32, a first arm plate 33, and a second arm plate (sliding member) 34.

The fixing plate 31 is fixed to a rear cover 13 to cover the back of the imaging apparatus 1 by screws (not illustrated). The second arm plate 34 is fixed to the protective cover 23 by screws (not illustrated).

Both ends of the slide plate 32 are formed in a U-shape, and slide rails 32a and 32b are respectively fitted into each of the both ends. The slide plate 32 is slidably assembled at both ends of the fixing plate 31 through the slide rails 32a and 32b. In the state in which the slide plate 32 is assembled to the fixed plate 31, a pin 32c provided on the slide plate 32 is inserted into a groove 31a formed on the fixed plate 31. The pin 32c abuts against an upper end of the groove 31a in the state of FIG. 2A, and abuts against a lower end of the groove 31a in the state of FIG. 2B. An abutment of the pin 32c against the upper and lower ends of the groove 31a restricts a slidable range of the slide plate 32 with respect to the fixed plate 31. That is, the display apparatus 20 can slide upward and downward in a range from the state of FIG. 2A to the state of FIG. 2B with respect to the imaging apparatus 1 through the hinge apparatus 30.

As illustrated in FIG. 4B, bent parts are formed at both ends of the slide plate 32, the first arm plate 33, and the second arm plate 34.

A rotation axis part 33a and a rotation axis part 34a are respectively provided above the bent parts of the first arm plate 33 and the second arm plate 34 to be coaxial each other. The rotation axis parts 33a and 34a are respectively caulked and fixed by pins 41a and 41b to sandwich click plates 42a and 42b. The rotation axis parts 33a and 34a receive biasing force and frictional resistance force from the click plates 42a and 42b, and the second arm plate 34 is configured to be rotatable with an appropriate rotational load with respect to the first arm plate 33 and becomes a state which can be held at an arbitrary angle.

A rotation axis part 32d and a rotation axis part 33b are respectively provided below the bent parts of the slid pate 32 and the first arm plate 33 to be coaxial each other. The rotation axis parts 32d and 33b are respectively caulked and fixed by pins 43a and 43b to sandwich click plates 44a and 44b. The rotation axis parts 32d and 33b receive biasing force and frictional resistance force from the click plates 44a and 44b, and the first arm plate 33 is configured to be rotatable with an appropriate rotational load with respect to the slide plate 32 and becomes a state which can be held at an arbitrary angle.

Figure 5A:
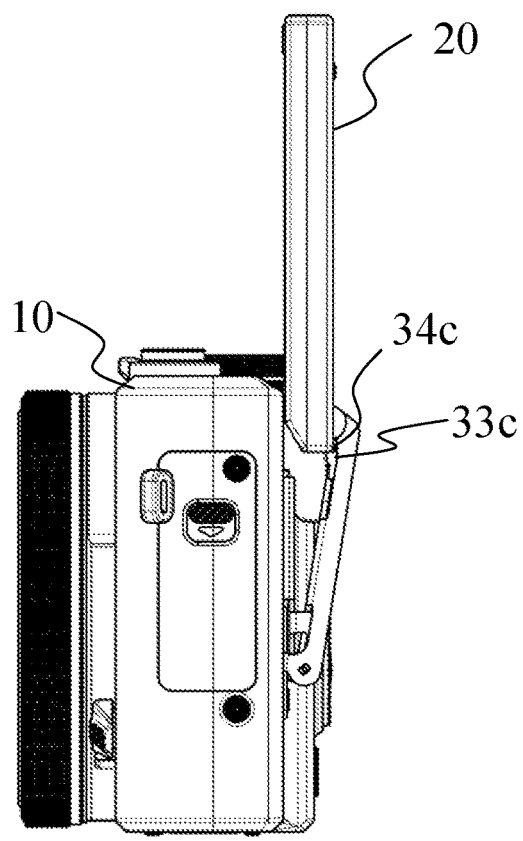
FIGS. 5A and 5B are explanatory diagrams of a rotation operation of a hinge apparatus (Embodiment 1).
Figure 5B:
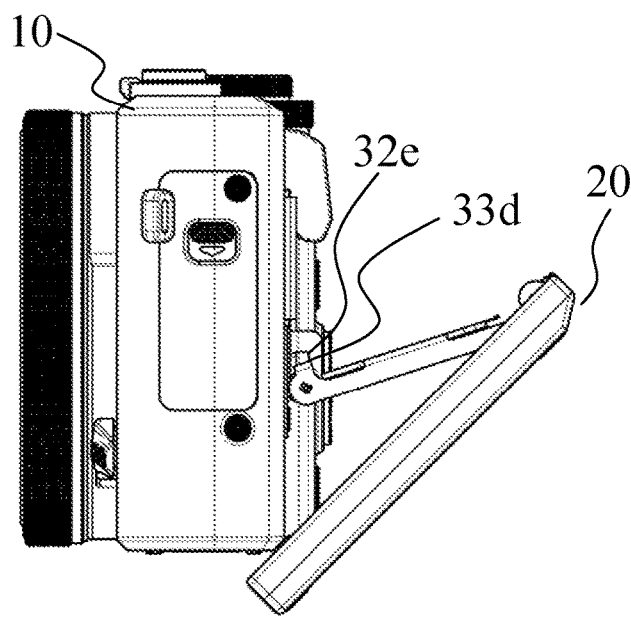

Hereinafter, referring to FIGS. 5A and 5B, a description will be given of a rotation range of the hinge apparatus 30. FIGS. 5A and 5B are explanatory diagrams of the rotation range of the hinge apparatus 30. FIG. 5A illustrates a state in which the hinge apparatus 30 tilts by 180 degrees upward. FIG. 5B illustrates a state in which the hinge apparatus 30 tilts by 45 degrees downward.

In the state of FIG. 5A, the display apparatus 20 abuts against the imaging apparatus 1 and a bent part 34c provided on the second arm plate 34 abuts against a concave part 33c provided on the first arm plate 33.

In the state of FIG. 5B, the display apparatus 20 abuts against the imaging apparatus 1 and a concave part 32e provided on the slide plate 32 abuts against a bent part 33d provided on the first arm plate 33.

According to the configuration described above, the display apparatus 20 is connected to the imaging apparatus body 10 through the hinge apparatus 30, and can vertically slide and tilt by 180 degrees upward and by 45 degrees downward with respect to the imaging apparatus 1 through the hinge apparatus 30.

Figure 6A:
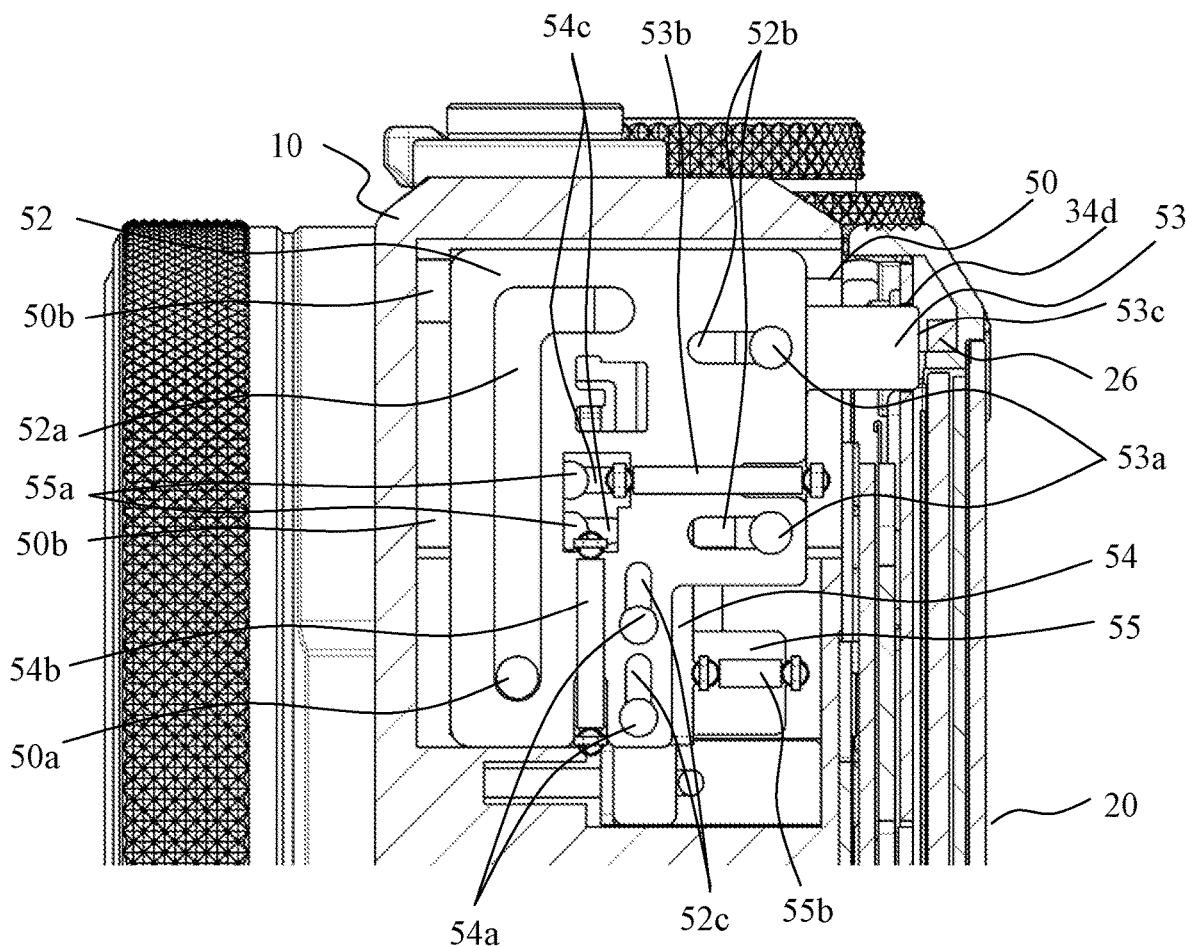
FIGS. 6A and 6B are explanatory diagrams of a support configuration of an electronic viewfinder (Embodiment 1).
Figure 6B:
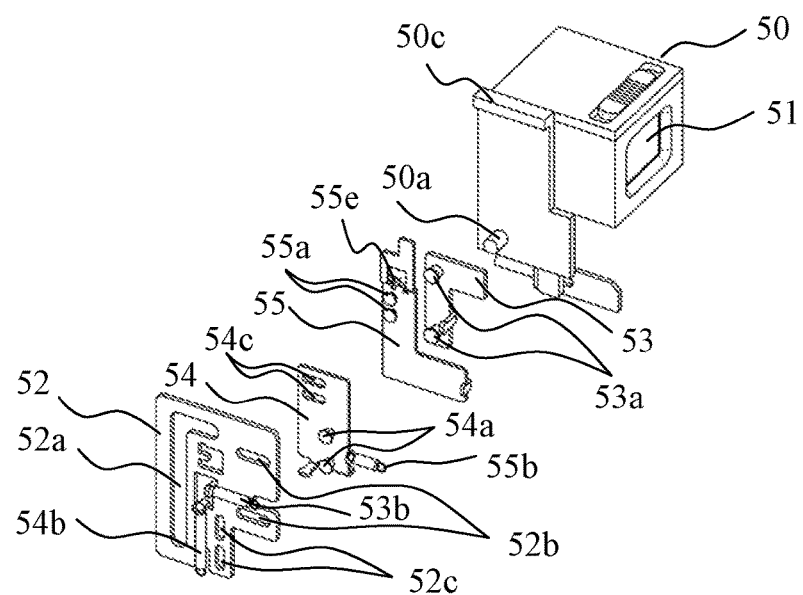

Next, referring to FIGS. 6A and 6B, a description will be given of a support configuration of the electronic viewfinder 50. FIGS. 6A and 6B are explanatory views of the support configuration of the electronic viewfinder 50. In FIGS. 6A and 6B, members unnecessary for the description are not illustrated. FIG. 6A illustrates a cross-sectional view of the imaging apparatus 1 when the display apparatus 20 is in the state of FIG. 2A. FIG. 6B is an exploded perspective view of the support member of the electronic viewfinder 50.

The electronic viewfinder 50 is primarily supported by a guide plate 52. The guide plate 52 is vertically slidably supported by a main chassis (not illustrated) provided on the imaging apparatus body 10.

Additionally, the electronic viewfinder 50 is guided by the guide plate 52, a lever (engaging member) 53, a charge plate 54, and a lock plate 55, and thereby can move from the housing position in which the electronic viewfinder 50 is housed in the imaging apparatus 1 to the position in which the electronic viewfinder 50 is usable.

A first guide pin 50a is provided on the electronic viewfinder 50, and is inserted into a first guide groove 52a formed in the guide plate 52. With this configuration, the electronic viewfinder 50 is movably supported against the guide plate 52. The electronic viewfinder 50 is also urged to a rear side (back side) of the imaging apparatus 1 by a first spring 50b. When the display apparatus 20 is in the state of FIG. 6A, the first guide pin 50a engages with a vertical groove of the first guide groove 52a and the electronic viewfinder 50 is held inside the imaging apparatus 1.

A second guide pin 53a is provided on the lever 53, and is inserted into a second guide groove 52b formed in the guide plate 52. With this configuration, the lever 53 is supported movably in a longitudinal direction of the imaging apparatus 1 by the guide plate 52. The lever 53 is also urged to a front side of the imaging apparatus 1 by a second spring (urging member) 53b.

A third guide pin 54a is provided on the charge plate 54, and is inserted into a third guide groove 52c formed in the guide plate 52. With this configuration, the charge plate 54 is movably in a vertical direction of the imaging apparatus 1 by the guide plate 52. The charge plate 54 is also urged to an upper side of the imaging apparatus 1 by a third spring 54b.

A fourth guide pin 55a is provide on the lock plate, and is inserted through the fourth guide groove 54c formed in the charge plate 54. With this configuration, the lock plate 55 is supported movably in the longitudinal direction of the imaging apparatus 1 by the charge plate 54. The lock plate 55 is also urged to the frond side of the imaging apparatus 1 by a fourth spring 55b.

The lever 53 is formed of a magnetic material and has a property of being attracted to the magnet. When the display apparatus 20 is in the state of FIG. 6A, a distance between the lever 53 and the magnet 26 which is adhered and fixed to the protective cover 23 is near. Thus, attractive force, a direction of which is opposite to a direction of the urging force by the second spring 53b, by the magnet 26 becomes larger than the urging force by the second spring 53b, and the lever 53 is attractive to the magnet 6 (moves to a side of the display unit). At this time, a tip part 53c of the lever 53 engages with a hole 34d formed in the second arm plate 34 constituting the hinge apparatus 30, and the lever 53 is operable in conjunction with a sliding operation in the vertical direction of the display apparatus 20. As the lever 53 is attracted to the magnet 26 in this state, a backlash of the display apparatus 20 decreases.

Hereinafter, referring to FIGS. 7A to 7I, a description will be given of a protruding operation and a housing operation of the electronic viewfinder 50. FIGS. 7A to 7I are explanatory diagrams of an operation of the electronic viewfinder 50. In FIGS. 7A to 7I, members unnecessary for the description are not illustrated.

First, referring to FIGS. 7A to 7D, a description will be given of the protruding operation of the electronic viewfinder 50. FIGS. 7A to 7D sequentially illustrates a state in which the electronic viewfinder 50 protrudes. The lower part of each figure is a partially enlarged view.

FIG. 7A illustrates a cross-sectional view of the imaging apparatus 1 in the state of FIG. 2A. In this state, the first guide pin 50a engages with the longitudinal groove of the first guide groove 52a. When the display apparatus 20 slides downward from the state of FIG. 7A, the guide plate 52, the charge plate 54 and lock plate 55 move downward together with the lever 53 that engages with the hole 34d formed in the second arm plate 34.

FIG. 7B illustrates a cross-sectional view of the imaging apparatus 1 while the display apparatus 20 moves to the lower end. In this state, the first guide pin 50a engages with a lateral groove of the first guide groove 52a. Additionally, the electronic viewfinder 50 starts to move to the rear side of the imaging apparatus 1 (right side of the figure) by the urging force of the first spring 50b.

FIG. 7C illustrates a cross-sectional view of imaging apparatus 1 in a state in which the first guide pin 50a abuts against a tip part 55c of the lock plate 55 during the movement of the electronic viewfinder 50. The lock plate 55 is urged to the front side of the imaging apparatus 1 (left side in the figure) by the fourth spring 55b, but since the urging force of the first spring 50b is larger than urging force of the fourth spring 55b, the rearward movement of the electronic viewfinder 50 is continued.

FIG. 7D illustrates a cross-sectional view of the imaging apparatus 1 in a state in which the first guide pin 50a abuts against the end of the lateral groove of the guide groove 52a to stop the movement of the electronic viewfinder 50. At this time, as illustrated in FIG. 2B, the electronic view finder 50 becomes a usable state, and stably stops in this state until a photographer performs an operation such as pressing the electronic view finder 50.

As described above, the protruding operation of the electronic viewfinder 50 starts by sliding the display apparatus 20 downward. The electronic viewfinder 50 protrudes in conjunction with the sliding operation of the display apparatus 20 to become usable.

Next, referring to FIGS. 7E to 7I, a description will be given of the housing operation of the electronic viewfinder 50. FIGS. 7E to 7I sequentially illustrates a state in which the electronic viewfinder 50 is housed. The lower part of each figure is a partially enlarged view.

When a photographer performs the pressing operation to the electronic viewfinder 50 in the usable state, the electronic view finder 50 starts the forward movement. A claw part 55e of the lock plate 55 moves forward together with the electronic viewfinder 50, but stops by abutting against a first stopper 52d provided on the guide plate 52. FIG. 7E illustrates a cross-sectional view of the imaging apparatus 1 in this state.

When the electronic viewfinder 50 is further depressed from the state of FIG. 7E, the first guide pin 50a is disengaged from a shoulder portion 55f of the lock plate 55. At this time, as the lock plate 55 is urged upward through the charge plate 54, the claw part 55e moves upward until abutting against a second stopper 52e provided in the guide plate 52. FIG. 7F illustrates a cross-sectional view of the imaging apparatus 1 in a state in which the claws 55e abuts against the second stopper 52e. In this state, as the claw part 55e is out of the first stopper 52d, the lock plate 55 starts the forward movement again with the movement of the electronic viewfinder 50.

By pressing the electronic viewfinder 50 until reaching a housing end from the state of FIG. 7F, the first guide pin 50a engages with the vertical groove of the first guide groove 52a. At this time, as the claw part 55e is out of the second stopper 52e, the lock plate 55 moves upward again until the claw part 55e abuts against a third stopper 52f provided in the guide plate 52. FIG. 7G illustrates a cross-sectional view of the imaging apparatus 1 in a state in which the claw part 55e abuts against the third stopper 52f.

Hereinafter, a description will be given of a case where a photographer stops pressing and releases the hand when the electronic viewfinder 50 is pressed to the housing end.

In the state of FIG. 7G, the claw part 55e abuts against the third stopper 52f. Thus, when a photographer releases the hand, the claw part 55e abuts against a fourth stopper 52g provided that has claw portions 55e also release the electronic viewfinder 50 provided on a side of the third stopper 52f, and an electronic viewfinder 50 maintains the state of FIG. 7G without returning the usable position. When a photographer slides the display apparatus 20 upward from a lower end position in this state, the guide plate 52, the charge plate 54, and the lock plate 55 move upward with the lever 53 that engages with the second arm plate 34.

FIG. 7H illustrates a cross-sectional view of the imaging apparatus 1 in a state in which a tip part 55d of the lock plate 55 abuts against a fifth stopper 50c provided in the electronic viewfinder 50. When the sliding operation of the display apparatus 20 continues, a sixth stopper 52h provided in the guide plate 52 abuts against the claw part 55e. When the sliding operation of the display apparatus 20 further continues, the claw part 55e bends to get over the sixth stopper 52h. FIG. 7I illustrates a cross-sectional view of the imaging apparatus 1 in this state.

The state of FIG. 7I is the same as the state of FIG. 7A, and the claw part 55e abuts against a seventh stopper 52i provided in the guide plate 52. Thus, when the display apparatus 20 slides downward, the lock plate 55 also slides in conjunction with the operation of the lever 53.

As described above, the housing operation of the electronic viewfinder 50 is started by pressing the protruded electronic viewfinder 50. The electronic viewfinder 50 is pressed to a housing end to be housed. In addition, sliding the display apparatus 20 upward after the electronic viewfinder 50 is housed can return the state in which the display apparatus 20 covers and conceals the electronic viewfinder 50.

As described above, when the display apparatus 20 is the state of FIGS. 2A and 2B, the lever 53 is attracted to the magnet 26 and is vertically movable in conjunction with the sliding operation of the display apparatus 20. As the tip part 53c of the lever 53 protrudes from the imaging apparatus body 10 but is covered by the display apparatus 20, a photographer cannot touch the tip part 53c. On the other hand, if the lever 53 remains protruded from the imaging apparatus body 10 when the display apparatus 20 tilts, the tip part 53c of the lever 53 is exposed to the outside. In this case, a photographer operates the lever 53 erroneously, and the display apparatus 20 that tilts upward by 180 degrees interferes with the lever 53.

Hereinafter, referring to FIGS. 8A to 8B, a description will be given of a behavior of the lever 53 when the display apparatus 20 tilts. FIGS. 8A and 8B are explanatory diagrams of the behavior of the lever 53 when the display apparatus 20 tilts. In FIGS. 8A and 8B, members unnecessary for the description are not illustrated. FIG. 8A illustrates a state in which the display apparatus 20 tilts by 45 degrees downward. FIG. 8B illustrates a state in which the display apparatus 20 tilts upward by 180 degrees.

When the display apparatus 20 tilts downward from the state of FIG. 2A, the magnet 26 separates from the lever 53 and the magnet flux to reach the lever 53 decreases. Thus, the urging force by the second spring 53b is larger than the attractive force by the magnet 26 at a predetermined angle (second angle), and the lever 53 is housed in the front side (main body unit side) of the imaging apparatus 1, that is, in the imaging apparatus bogy 10. As illustrated in FIG. 8A, when the display apparatus 20 tilts by 45 degrees downward, the magnet 26 further separates from the lever 53, and the housing state of the lever 53 is maintained. Accordingly, a photographer cannot touch the lever 53.

When the display apparatus 20 tilts upward from the state of FIG. 2A, the magnet 26 separates from the lever 53 and the magnet flux to reach the lever 53 decreases. Thus, the urging force by the second spring 53b is larger than the attractive force by the magnet 26 at a predetermined angle (third angle), and the lever 53 is housed in the front side of the imaging apparatus 1, that is, in the imaging apparatus bogy 10. As illustrated in FIG. 8B, when the display apparatus 20 tilts by 180 degrees upward, the magnet 26 does not separate very much from the lever 53, but the housing state of the lever 53 is maintained. Accordingly, interference between the lever 53 and the display apparatus 20 can be prevented.

According to the configuration described above, the erroneous operation of the lever 53, and the interference between the lever 53 and the display apparatus 20 can be prevented.

Hereinafter, referring to FIGS. 9A to 9C, a description will be given of a display switching method of the display apparatus 20 when the display apparatus 20 is operated. FIGS. 9A to 9C are explanatory diagrams of the display switching method of the display apparatus 20 when the display apparatus 20 is operated. In FIGS. 9A to 9C, members unnecessary for the description are not illustrated. FIG. 9A illustrates the imaging apparatus 1 when the display apparatus 20 is in the state of FIG. 2A. FIG. 9B illustrates the imaging apparatus 1 when the display apparatus 20 tilts by 180 degrees upward. FIG. 9C illustrates the imaging apparatus 1 when the display apparatus 20 slides to the lower end.

First, a description will be given of the display switching method of the display apparatus 20 when the display apparatus 20 tilts. As illustrated in FIGS. 9A and 9B, the magnet 26 is adhered and fixed to the concave part 23a formed in the protective cover 23. The imaging apparatus 1 includes magnetic sensors 71 and 72 mounted on a substrate (not illustrated).

When the display apparatus 20 tilts from the state of FIG. 9A to the state of FIG. 9B to reach a predetermined position, the magnetic flux that is generated from the magnet 26 and is detected by the magnetic sensor (second detector) 71 becomes larger than a predetermined value (second predetermined value). At this time, a direction of the display image of the display apparatus 20 is switched. At the time of shooting, a vertical inversion and a mirror display suitable for self-portrait photography is performed, and at the time of reproducing, the mirror display is not performed and the display in which only the upper and lower sides are reversed is performed.

When the display apparatus 20 tilts from the state of FIG. 9B to the state of FIG. 9A to reach a predetermined position, the magnetic flux that is generated from the magnet 26 and is detected by the magnetic sensor 71 becomes smaller than the predetermined value. At this time, the display of the display apparatus 20 is switched so that the direction of the display becomes a normal direction.

From the above, tilting the display apparatus 20 tilts by an angle larger than a predetermined angle (fourth angle) can switch the direction of the display of the display apparatus 20.

Next, a description will be given of the display switching method of the display apparatus 20 when the display apparatus 20 slides.

When the display apparatus 20 slides from the state of FIG. 9A to the state of FIG. 9C to reach a predetermined position, the magnetic flux that is generated from the magnet 26 and is detected by the magnetic sensor (first detector) 72 becomes larger than a predetermined value (first predetermined value). Here, the predetermined position is a position where the display apparatus 20 slides from the housing position by the predetermined value. At this time, the display of the display apparatus 20 stops and a display of the electronic viewfinder 50 starts.

When the display apparatus 20 slides from the state of FIG. 9C to the state of FIG. 9A to reach a predetermined position, the magnetic flux that is generated from the magnet 26 and is detected by the magnetic sensor 72 becomes smaller than the predetermined value. At this time, the display of the electronic viewfinder 50 stops and the display of the display apparatus 20 starts.

As described above, when the display apparatus 20 slides from the housing position by a distance larger than the predetermined value, the display of the display apparatus 20 can stop and the display of the electronic viewfinder 50 can start. Thus, the electronic viewfinder 50 can be used promptly.

As described above, when the display apparatus 20 slides downward, the electronic viewfinder 50 protrudes a photographer side to be exposed. When the display apparatus 20 tilts upward in this state, the display apparatus 20 interferes with the electronic viewfinder 50 and thereby the display apparatus 20 and the electronic viewfinder 50 are damaged and, in the worst case, breaks down.

Hereinafter, a description will be given of a method for preventing interference between the display apparatus 20 and the electronic viewfinder 50.

Figure 10A:
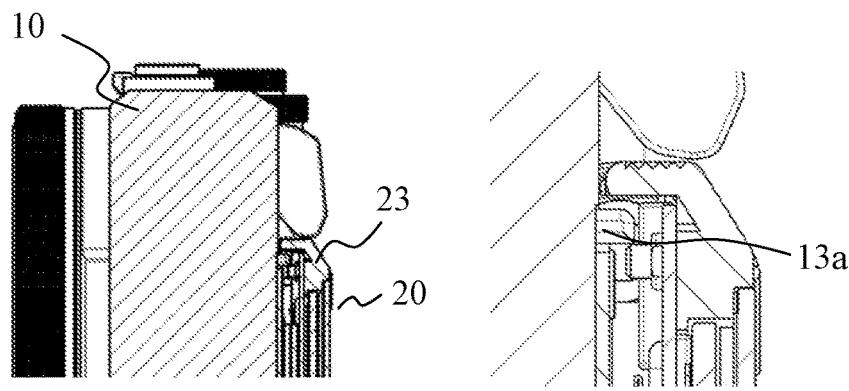
FIGS. 10A to 10C are explanatory diagrams of a behavior of the display apparatus which slides downward when tilting upward (Embodiment 1).
Figure 10B:
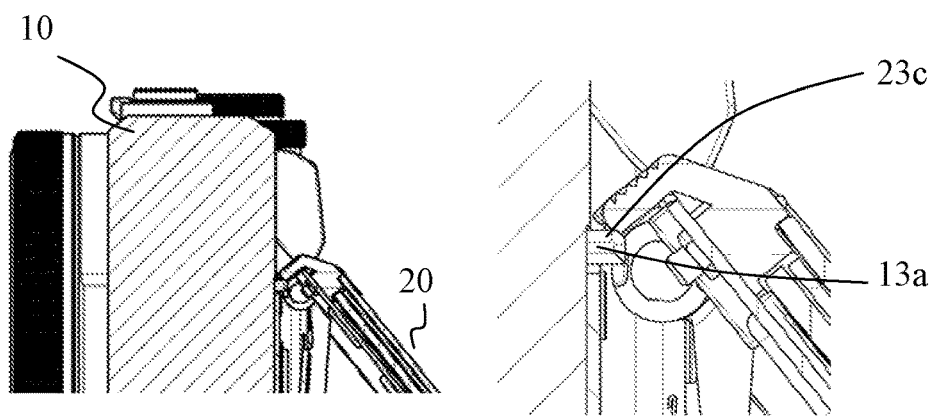
Figure 10C:
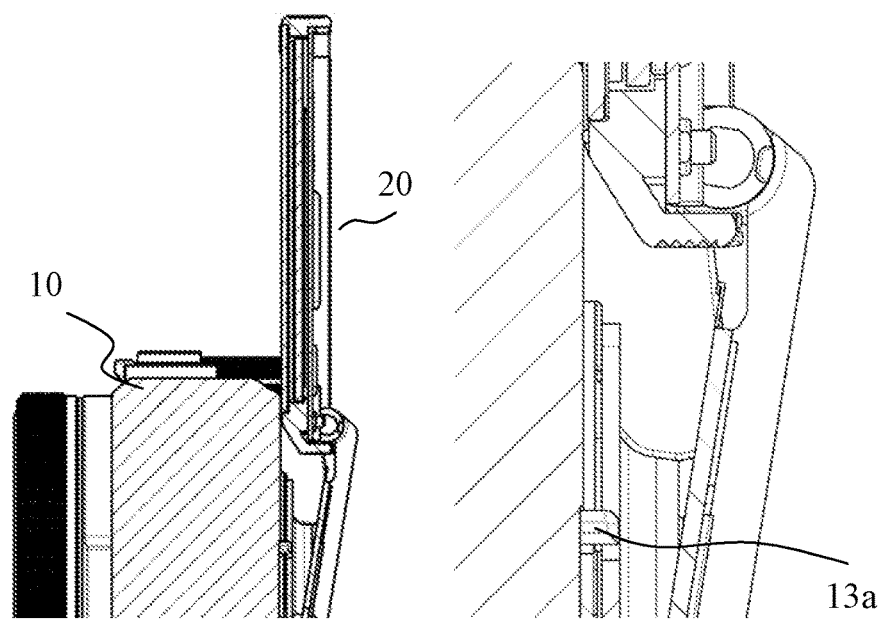

First, referring to FIGS. 10A to 10C, a description will be given of a behavior of the display apparatus 20 which slides downward when tilting upward. FIGS. 10A to 10C are explanatory diagrams of the behavior of the display apparatus 20 which slides downward when tilting upward. In FIG. 10A to 10C, members unnecessary for the description are not illustrated.

FIG. 10A illustrates the imaging apparatus 1 when the display apparatus 20 slides downward. FIG. 10B illustrates the imaging apparatus 1 when the display apparatus 20 which slides downward tilts upward. FIG. 10C illustrates the imaging apparatus 1 when the display apparatus 20 which does not slide downward tilts upward. The right figure of each figure is a partially enlarged view.

As illustrated in FIGS. 4A and 4B, three protruding members (regulating members) 13a are provided on the back of the main body of the imaging apparatus 1. Each of the protruding members 13a is in a protruding shape formed on a rear inner (not illustrated) fixed in an inner surface of the rear cover 13, and is inserted into a hole formed in the rear cover 13 to be exposed to the outside.

In the state of FIG. 10A, each of the protruding member 13a does not abut against any of the members. In the state of FIG. 10B, the three protruding members 13a respectively abut against a tip part (abutting member) 23c which is provided in the protective member 23 and is a vertical wall. Abutment of the protruding members 13a and the tip part 23c restricts the upward tilt operation of the display apparatus 20 from the position of FIG. 10B.

Further, in the state of FIG. 10C, even when the display apparatus 20 tilts upward, the protruding members 13a does not abut against any of the members. Accordingly, as illustrated in FIG. 10C, the display apparatus 20 can tilt to 180 degrees upward.

As described above, in this embodiment, the protruding members 13a abut against the tip part 23c before the display apparatus 20 and the electronic viewfinder 50 come into contact with each other. Thus, the interference between the display apparatus 20 and the electronic viewfinder 50 due to the tilt operation of the display Apparatus 20 can be prevented.

In this embodiment, each of the three protruding members 13a abuts against the tip part 23c provided on the protective cover 23. However, the present invention is not limited to this. If at least one or more protruding members provided on the imaging apparatus body 10 can abut against an abutting member provided on the display apparatus 20, the number of the protruding member, a position of the protruding member, and a position of the abutting member are not restricted.

Further, adjusting the position of the protruding members 13a can adjust an angle (first angle) which restricts the tilt operation when the display apparatus 20 which slides downward tilts upward. The first angle is an angle of 0 degrees or more. That is, the first angle may be 0 degrees.

Figure 11A:
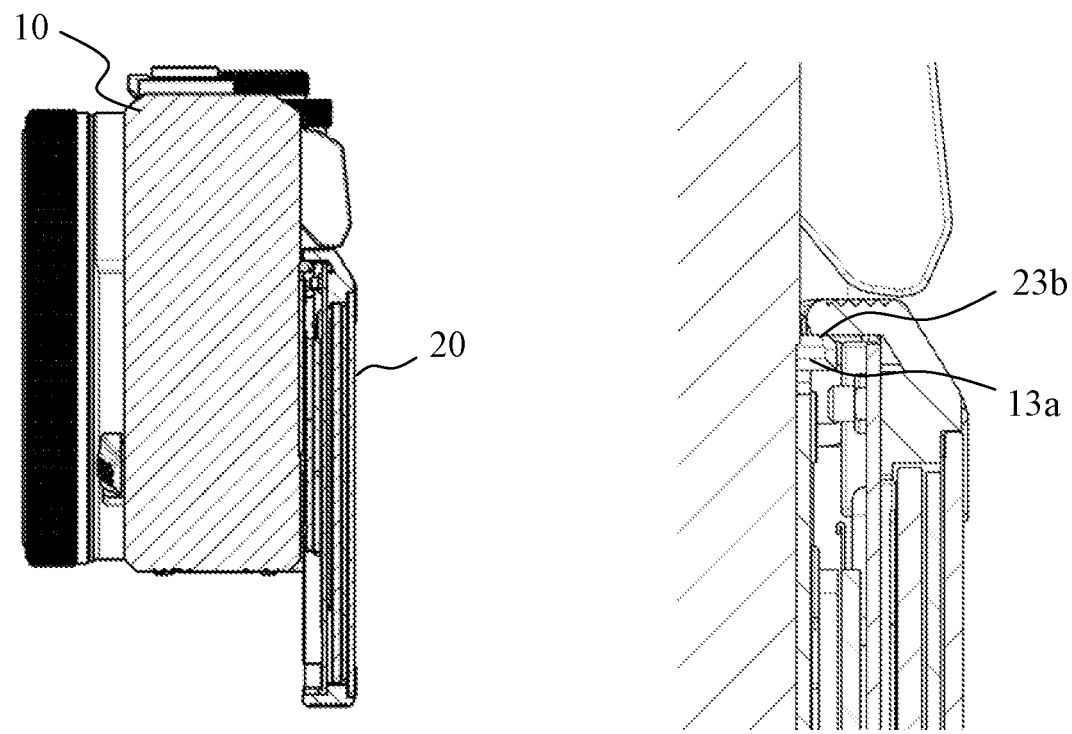
FIGS. 11A and 11B are explanatory diagrams of a behavior of the display apparatus when a position of a protruding member is vertically adjusted which slides downward when tilting upward (Embodiment 1).
Figure 11B:
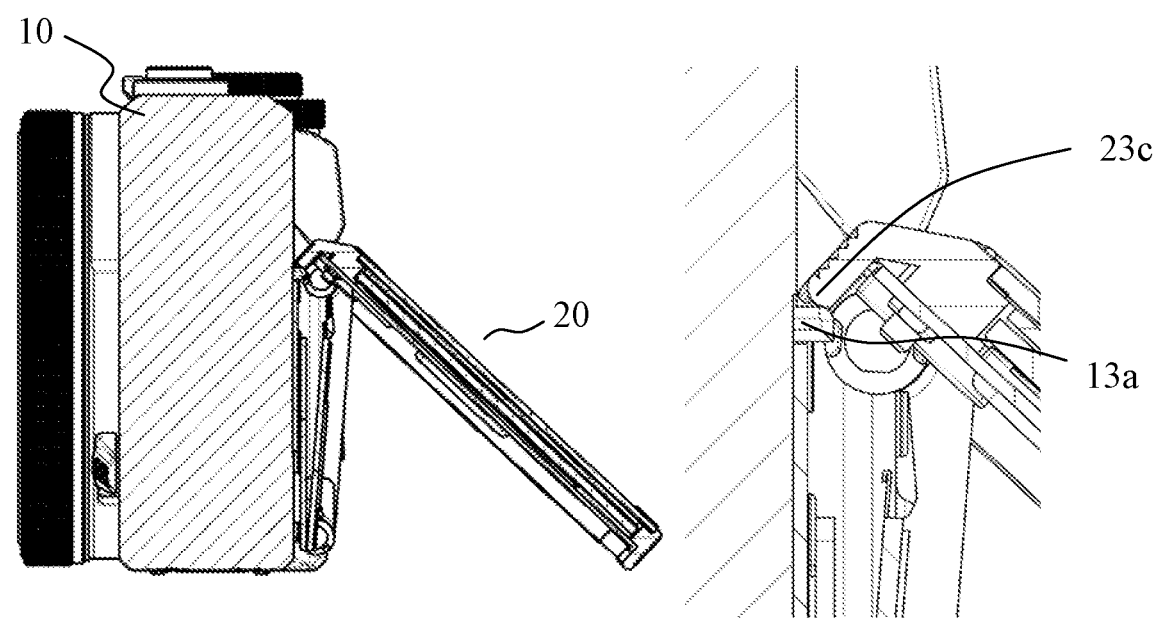

Hereinafter, referring to FIGS. 11A and 11B, a description will be given of a behavior of the display apparatus 20 when the positions of the protruding members 13 are vertically adjusted. FIGS. 11A and 11B are explanatory diagrams of the behavior of the display apparatus 20 when the positions of the protruding members 13a are vertically adjusted. In FIGS. 11A and 11B, members unnecessary for the description are not illustrated.

FIG. 11A illustrates the imaging apparatus 1 when the positions of the protruding members 13a are adjusted to an upper side. FIG. 11B illustrates the imaging apparatus 1 when the protruding members 13a are adjusted to a lower side. The right figure of each figure is a partially enlarged view.

In the state of FIG. 11A, the protruding members 13a abut against an inner wall (abutting member) 23b of the standing wall provided in the protective cover 23. As the protruding members 13b abut against the inner wall 23b, the display apparatus 20 cannot tilt upward from the state of FIG. 11A.

In the state of FIG. 11B, the protruding members 13a abut against the tip part 23c while the display apparatus 20 has a tilt operation angle larger than a tilt operation angle in the state of FIG. 10B. At this time, the lowermost surface of the protective cover 23 is located above the bottom surface of the imaging apparatus body 10. Thus, the imaging apparatus 1 can be placed on a desk optimum, and a tripod can be used.

As described above, when the display apparatus 20 which slides downward tilts upward, the tilt operation is restricted, and the interference between the display apparatus 20 and the electronic viewfinder 50 can be prevented. On the other hand, when the display apparatus 20 slides upward without pressing the electronic viewfinder 50 in a the housing direction while the electronic viewfinder 50 protrudes, the display apparatus 20 interferes with the electronic viewfinder 50.

Figure 12A:
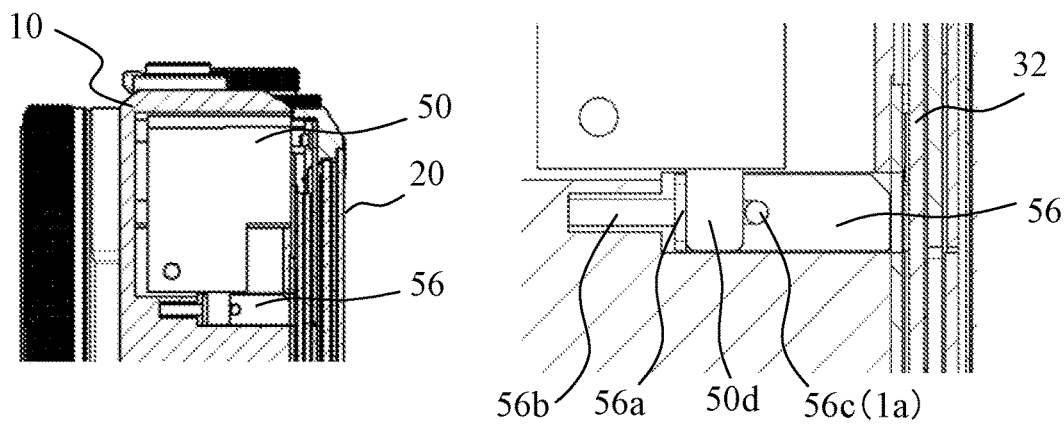
FIGS. 12A to 12C are explanatory diagrams of a behavior of the display apparatus which slides downward when sliding upward (Embodiment 1).
Figure 12B:
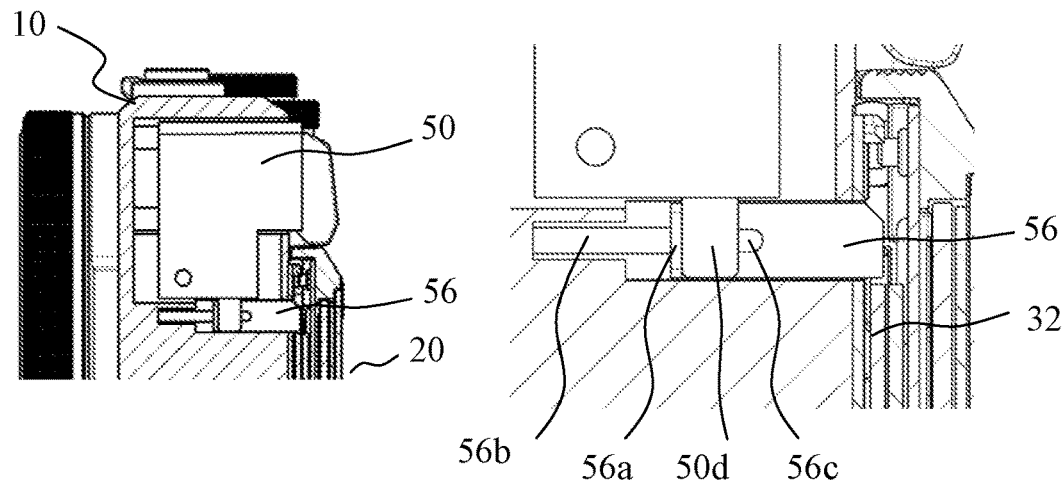
Figure 12C:
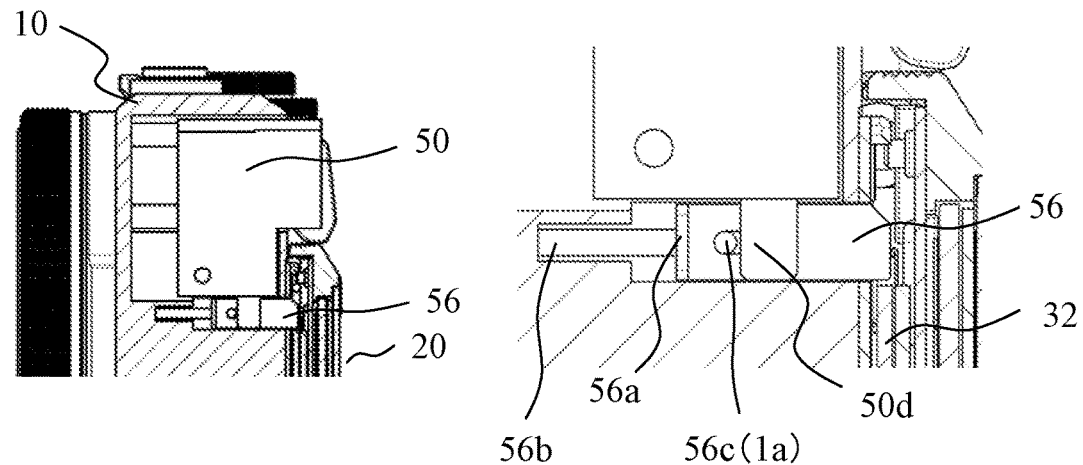

Hereinafter, referring to FIGS. 12A to 12C, a description will be given of a behavior of the display apparatus 20 which slides downward when sliding upward. FIGS. 12A to 12C are explanatory diagrams of the behavior of the display apparatus 20 which slides downward when sliding upward. In FIGS. 12A to 12C, members unnecessary for the description are not illustrated.

FIG. 12A illustrates the imaging apparatus 1 when the display apparatus 20 is in the state of FIG. 2A. FIG. 12B illustrates the imaging apparatus 1 when the electronic viewfinder 50 protrudes halfway. FIG. 12C illustrates the imaging apparatus 1 when the electronic viewfinder 50 protrudes to the use position (stop position). The right figure of each figure is a partially enlarged view.

Below the electronic viewfinder 50, a lock lever 56 is provided. An axis 1a provided in the imaging apparatus body 10 is inserted into a guide groove 56c formed in the lock lever 56. For this reason, the electronic viewfinder 50 is supported slidably in the longitudinal direction with respect to the imaging apparatus body 10. Additionally, the lock lever 56 is urged to the rear side of the imaging apparatus 1 by a fifth spring 56b. When the display apparatus 20 is in the state of FIG. 12A, that is, the electronic viewfinder 50 is in the housing state, a bent part 56a provided in the lock lever 56 is pushed by a protruding member 50d provided below the electronic viewfinder 50. Thus, the electronic viewfinder 50 is housed inside the imaging apparatus body 10. Then, the display apparatus 20 can slide in the vertical direction without interfering with the lock lever 56.

As illustrated in FIG. 12B, when the electronic viewfinder 50 protrudes by sliding the display apparatus 20 downward, the protruding member 50d of the electronic viewfinder 50 also moves backward. Thus, the lock lever 56 is urged by the fifth spring 56b to start the backward movement, and protrudes to a position where a tip of the lock lever 56 engages with an upper end of the slide plate 32.

When the electronic viewfinder 50 protrudes from the state of FIG. 12B to the state of FIG. 12C, the axis 1a abuts against an end of the guide groove 56c, and the lock lever 56 does not protrudes from a position of FIG. 12B.

When the display apparatus 20 slides upward from the state of FIG. 12B and FIG. 12C, the upper end of the slide plate 32 interferes with the tip of the lock lever 56, and the upward sliding is locked. With this configuration, even when the display apparatus 20 which slides downward slides upward while the electronic viewfinder 50 protrudes, the interference between the display apparatus 20 and the electronic viewfinder 50 can be prevented.

As described above, even when the electronic view finder 50 protrudes from the state of FIG. 12B to the state of FIG. 12C, the lock lever 56 does not protrude from the position of FIG. 12B. With this configuration, a movement quantity of the lock lever 56 is shorter than that of the electronic viewfinder 50, and the interference between the lock lever 56 and internal components of the display apparatus 20 can be prevented. In addition, a timing when the lock of the lock lever 56 is released can delay until the electronic viewfinder 50 is housed, and the interference between the display apparatus 20 and the electronic viewfinder 50 can be more effectively prevented.

As described above, in various situations, the interference between the display apparatus 20 and the electronic viewfinder 50 due to the tilt operation of the display apparatus 20 can be prevented.

In this embodiment, the electronic viewfinder 50 protrudes in conjunction with the slide of the display apparatus 20, the present invention is not limited to this. The electronic viewfinder 50 may protrude by operating a lever and an operation button provided separately. The electronic viewfinder 50 may protrude by pinching the electronic viewfinder 50 itself, and by pressing the electronic viewfinder 50.

Further, in this embodiment, the electronic viewfinder 50 is exposed from an area generated by sliding the display apparatus 20, but the present invention is not limited to this. Other apparatus, such as an optical finder and a stroboscopic apparatus, may be exposed.

Embodiment 2

Hereinafter, referring to FIGS. 13A to 13D, a description will be given of an operation of the display apparatus 20. FIGS. 13A to 13D are explanatory diagrams of the operation of the display apparatus 20.

Figure 13A:
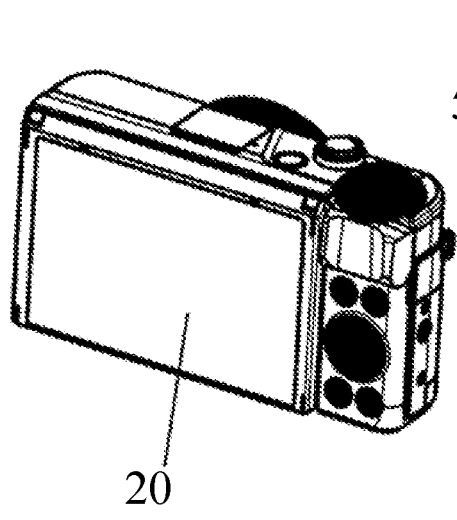
FIGS. 13A to 13D are explanatory diagrams of an operation of a display apparatus (Embodiment 2).

FIG. 13A illustrates a state in which the display apparatus 20 is housed in the imaging apparatus 1. In this state, a photographer can shoot an object in front, and reproduce and display a photographed image.

Figure 13B:
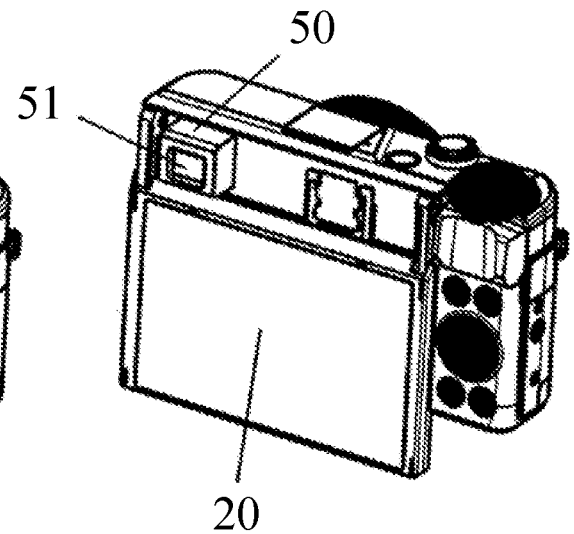

FIG. 13B illustrates a state in which the display apparatus 20 slides downward. In this state, a photographer can use the electronic viewfinder 50. Sliding the display apparatus 20 downward moves the electronic viewfinder 50 to an area in which the display apparatus 20 is not existed, and thereby the electronic viewfinder 50 protrudes from a housing position in which the electronic viewfinder 50 is housed in the imaging apparatus 1 to a position (use position) in which the electronic viewfinder 50 is usable. The electronic viewfinder 50 includes a small display, a lens, and an eyepiece window 51. A photographer looks into the electronic viewfinder 50 through the eyepiece window 51 to confirm the object image to be photographed or the photographed image.

Figure 13C:
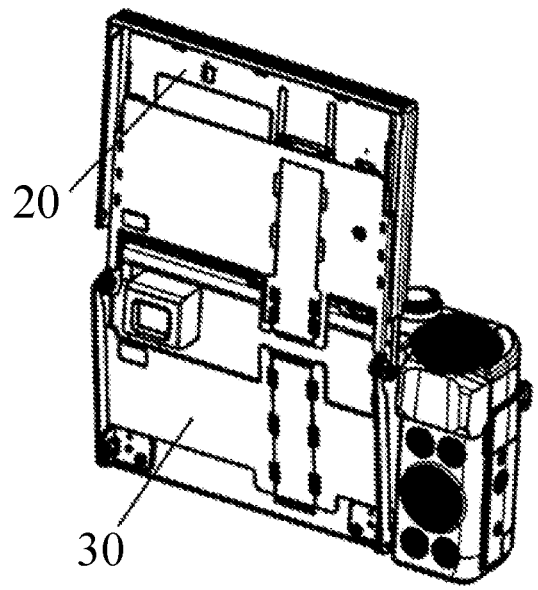

FIG. 13C illustrates a state in which the display apparatus 20 tilts from the state of FIG. 13B in which the display apparatus 20 slides downward by 180 degrees upward. In this state, a display surface of the display apparatus 20 is directed to an object side to enable the photographer to easily perform self-shooting. In addition, the display apparatus 20 is configured not to collide with the electric viewfinder 50 even when tilting while the electronic viewfinder 50 protrudes to the use position. As a result, the display apparatus 20 can be tilted upward without moving the electronic viewfinder 50 to the housing position after a user uses the electronic viewfinder 50. The display apparatus 20 is adjusted to be an arbitrary angle between the state of FIG. 13A and the state of FIG. 13C with respect to the imaging apparatus body. Such adjustment is mainly performed when a photographer holds the imaging apparatus 1 low to shoot an object.

Figure 13D:
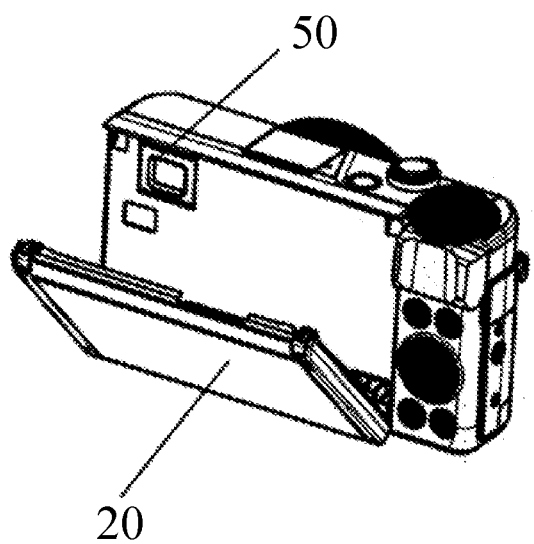

FIG. 13D illustrates a state in which the display apparatus 20 tilts by 45 degrees downward. This state is mainly used when a photographer holds the imaging apparatus 1 high to shoot.

As described above, even when the position of the imaging apparatus 1 with respect to a photographer changes, tilting the display apparatus 20 can direct the display surface of the display apparatus 20 toward a photographer, and a photographer can view the display apparatus 20 in an optimal state. Furthermore, even when the electronic viewfinder 50 protrudes to the use position, a user can tilt the display apparatus 20 at an arbitrary angle without moving the electronic viewfinder 50 to the housing position.

Figure 14:
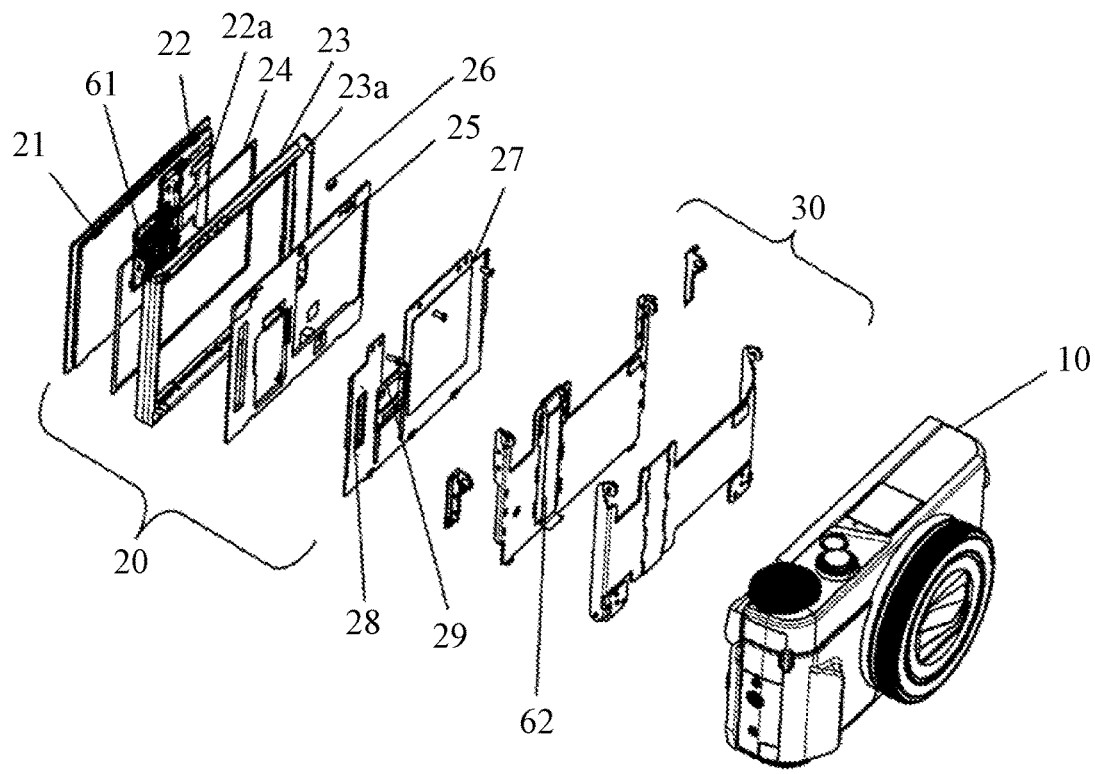
FIG. 14 is an exploded perspective view of the display apparatus (Embodiment 2).

Next, referring to FIG. 14, a description will be given of a configuration of the display apparatus 20. FIG. 14 is an exploded perspective view of the display apparatus 20. In FIG. 14, the imaging apparatus body 10 and the hinge apparatus 30 are also illustrated for the sake of clarity.

The display apparatus 20 includes a protective window 21, an electrostatic capacitance touch panel (not illustrated) for performing an input operation by contact by a photographer, a liquid crystal display 22, and a protective cover (protector) 23.

The protective window 21 is a panel whose outer shape is larger than an outer shape of the liquid crystal display 22 and which protects the liquid crystal display 22 and the touch panel from scratches and dirt. In this embodiment, as the protective window 21, strengthened glass having a thickness of about 0.5 to 1.0 mm is used, but a transparent resin, such as an acrylic resin or a polycarbonate, having high light transmittance may be used.

The protective window 21 is adhered to the protective cover 23 integrally with the touch panel and the liquid crystal display 22 by a square-shaped double-sided tape 24 formed along the outer periphery of the protective window 21. The protective cover 23 is an outside appearance member that covers the periphery of the display apparatus 20 to protect the display apparatus 20.

The touch panel is a capacitive type, and the wiring of the touch panel is formed of an ITO (Indium Tin Oxide) which is a transparent conductive film. The touch panel is generally formed of a glass, but may be formed of a resin material which is transparent and can withstand temperatures such as annealing of the ITO. As a transparent resin material, for example, an acrylic resin or a polycarbonate resin can be used.

A substrate 61 is attached a back of the liquid crystal display 22 by a double-sided tape (not illustrated). The substrate 61 is connected to a flexible printed substrate 22a provided in the liquid crystal display 22 through a connector mounted on the substrate 61.

A flexible printed substrate 62 has a first end that is connected to the substrate 61 through a connector mounted on the substrate 61, and a second end that is connected to the main substrate provided inside the imaging apparatus 1 (not illustrated). With this configuration, an electrical signal from the main substrate is transmitted to the display apparatus 20.

A spacer 25 is formed by a molding resin member, and is assembled to the protective cover 23 from a direction opposite to an assembling direction of the protective window 21. The spacer 25 is sandwiched between the protective cover 23 and a slide plate 27 described below, and is fixed to close a gap between the protective cover 23 and the slide plate 27.

A magnet (magnetic field generator) 26 is housed in a concave part 23a formed in the protective cover 23, and is adhered and fixed to the concave part 23a. When a magnetic sensor described later detects a magnetic flux that varies with a position of the magnet 26, switching of ON/OFF of display and a display direction of the display apparatus 20 is executed. As the magnetic sensor to detect the magnetic flux, a giant magnet resistance (GMR) element or a semiconductor hall element is generally used. The GMR element is a device that detects the magnetic flux parallel to a main surface by using the magnet resistive effect, and is made from an alloy (specifically, the main components of which are nickel, iron, and cobalt) having a property that electrical resistance increases as the magnetic flux becomes stronger. Assembling the GMR element to a determination circuit forms a GMR sensor. In this embodiment, the GMR sensor detects the magnetic flux that varies with the position of the magnet 26 to switch the display of the display apparatus 20.

The slide plate 27, which is held slidably to the hinge apparatus 30, is formed of a sheet metal material, and is screwed to the cover member 23 with the spacer 25 interposed therebetween.

A click plate 28 is a sheet metal part fixed to the slide plate 27 and having a leaf spring shape, and is configured to give a click feeling in both the housing position and the slide position when the display apparatus 20 slides.

A slider mechanism 29 is disposed between the spacer 25 and the slide plate 27 and urges the flexible printed substrate 62 in a predetermined direction so that the flexible printed substrate 62 does not sag when the display apparatus 20 slides.

Figure 15:
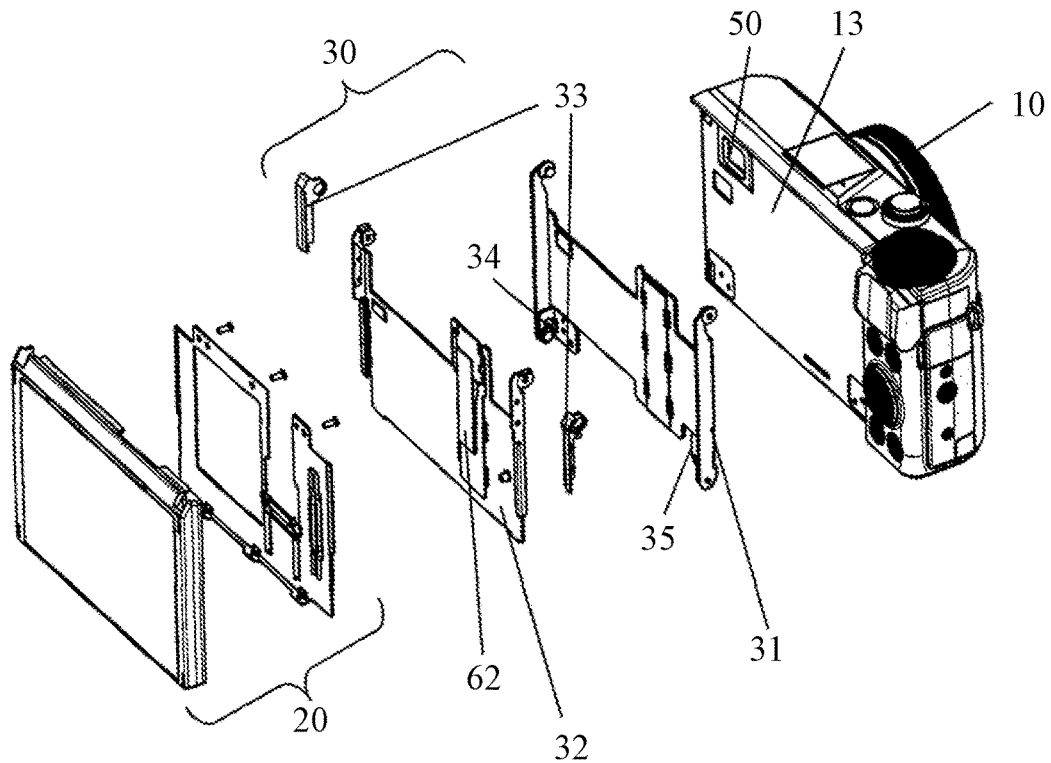
FIG. 15 is an exploded perspective view of a hinge apparatus (Embodiment 2).
Figure 16:
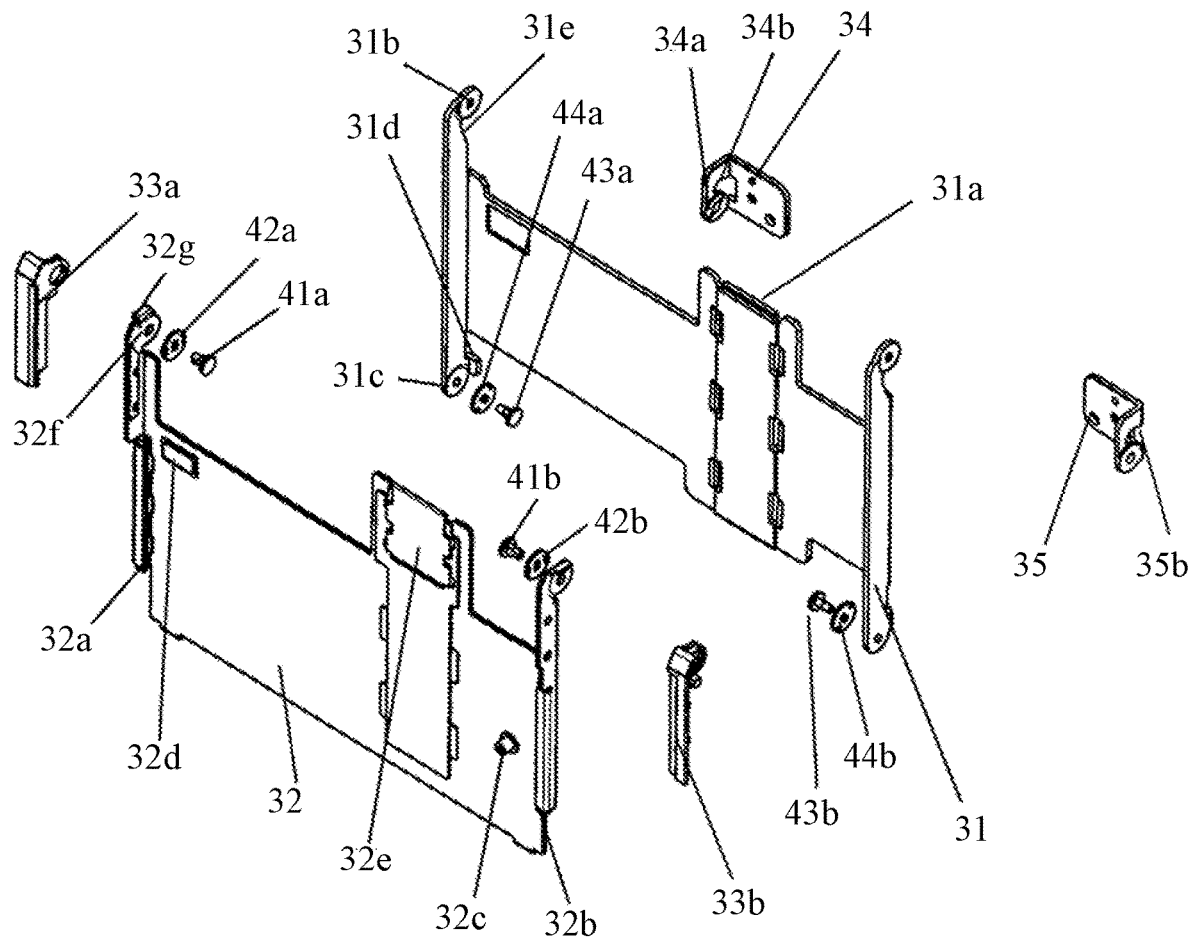
FIG. 16 is an enlarged view of a part of the hinge apparatus (Embodiment 2).

Next, referring to FIGS. 15 and 16, a description will be given of a configuration of the hinge apparatus 30. FIG. 15 is an exploded perspective view of the hinge apparatus 30. In FIG. 15, the imaging apparatus body 10 and the display apparatus 20 are also illustrated to make the explanation easy to understand. FIG. 16 is an enlarged view of a part of the hinge apparatus 30.

The hinge apparatus 30 includes a base plate (first hinge member) 31, an arm plate (second hinge member) 32, a hinge cover 33, and stand plates 34 and 35. At both ends of the base plate 31 and the arm plate 32, bent parts are formed. The stand plates 34 and 35 are fixed to the back cover 13 covering the back surface of the imaging apparatus 1 by screws (not illustrated).

A rotation axis part 31c is provided below the bent part of the base plate 31. A rotation axis part 34a is provided at the bent part of the stand plate 34. A rotation axis part 35a is provided at the bent part of the stand plate 35. The stand plate 34 is assembled to the base plate 31 such that the rotation axis part 34a is coaxial with the rotation axis part 31c. The stand plate 35 is assembled to the base plate 31 such that the rotation axis part 35a is coaxial with the rotation axis part 31c. The rotation axis parts 31c and 34a are caulked and fixed by the pin 43a to sandwich the click plate 44a. The rotation axis parts 31c and 35a are caulked and fixed by the pin 43b to sandwich the click plate 44b. The rotation axis part 31c receives the urging force and the frictional resistance force from the click plates 44a and 44b, and the base plate 31 is configured to be rotatable with an appropriate rotational load with respect to the stand plates 34 and 35 to be held at an arbitrary angle.

A rotation axis part 31b and 32f are respectively coaxially provided above the base plate 31 and the arm plate 32 when assembled. The rotation axis parts 31b and 32f are caulked and fixed by the pins 41a and 41b to sandwich the click plates 42a and 42b. The rotation axis parts 31b and 32f receive the urging force and the frictional resistance force from the click plates 42a and 42b, and the arm plate 31 is configured to be rotatable with an appropriate rotational load with respect to the base plate 31 to be held at an arbitrary angle.

Hinge covers 33a and 33b for protecting the edge of the sheet metal are fixed on both sides of the upper end of the arm plate 32, respectively. The both ends of the arm plate 32 are formed in a U-shape, and slide rails 32a and 32b are respectively fitted in each of the both ends. The slide plate 27 is assembled vertically slidably through the slide rails 32a and 32b. The slide pin 32c is fixed to the arm plate 32. The slide pin 32c can slide while engaging with the click plate 28.

Further, a yoke plate 32d is fixed to the arm plate 32. The yoke plate 32d generates attractive force to the magnet 26 in a state in which the display apparatus 20 slides. Flexible guards 31a and 32e are respectively provided on the base plate 31 and the arm plate 32. The flexible guards 31a and 32e cover the flexible printed substrate 62.

Figure 17A:
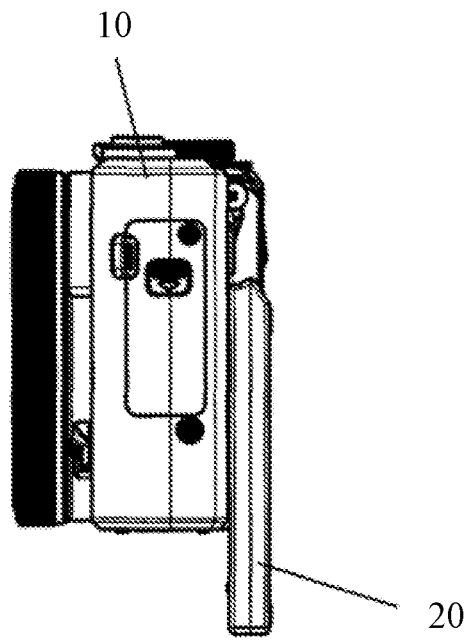
FIGS. 17A to 17C are explanatory diagrams of an operation range of the display apparatus (Embodiment 2).
Figure 17B:
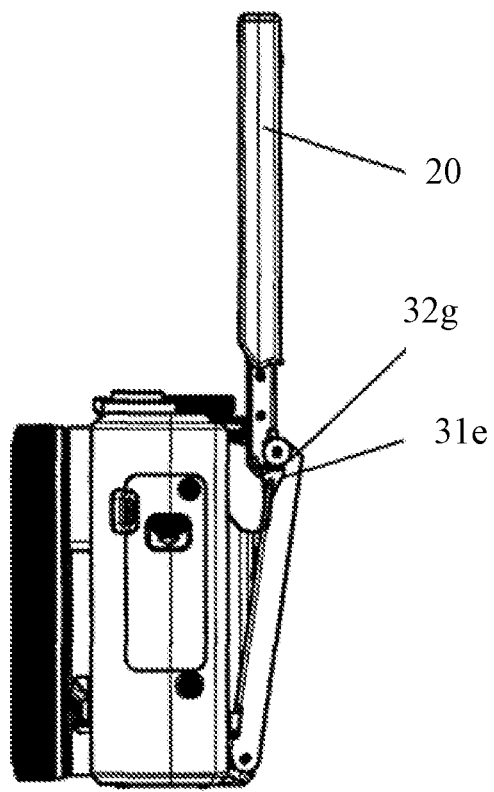
Figure 17C:
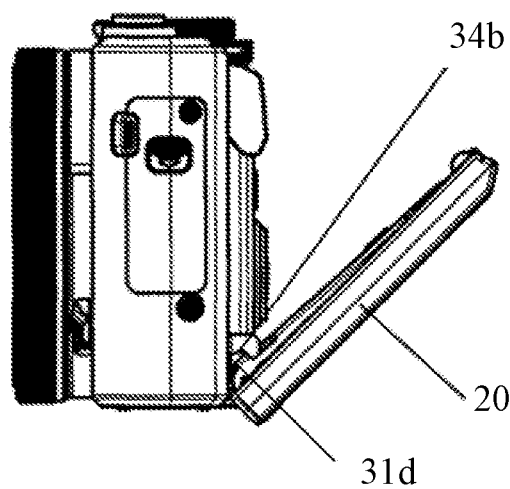

Next, referring to FIGS. 17A to 17C, a description will be given of an operation range of the display apparatus 20. FIGS. 17A and 17c are explanatory diagram of the operation range of the display apparatus 20. FIG. 17A illustrates a state in which the display apparatus 20 slides downward. FIG. 17B illustrates a state in which the display apparatus 20 which slides downward tilts by 180 degrees upward. FIG. 17C illustrates a state in which the display apparatus 20 tilts by 45 degrees downward.

In the state of FIG. 17A, when the slide plate 27 slides with respect to the hinge apparatus 30, the display apparatus 20 slides downward with respect to the imaging apparatus body 10 and stops. At this time, an abutting part (not illustrated) of the cover member 23 abuts against on an end surface (not illustrated) of the arm plate 32 to determine the position of the display apparatus 20. In the state of FIG. 17A, the hinge apparatus 30 does not slide with respect to the imaging apparatus body 10.

In the state of FIG. 17B, the display apparatus 20 abuts against the imaging apparatus body 10, and a bend part 32g provided on the arm plate 32 abuts against a concave part 31e provided on the base plate 31.

In the state of FIG. 17C, the bent part 31a provided on the base plate 31 abuts against a concave part 34b provided on the stand plate 34.

According to the configuration described, the display apparatus 20 is vertically slidable with respect to the hinge apparatus 30, and the hinge apparatus 30 is tiltable by 180 degrees upward and by 45 degrees downward with respect to the imaging apparatus body 10.

Figure 18A:
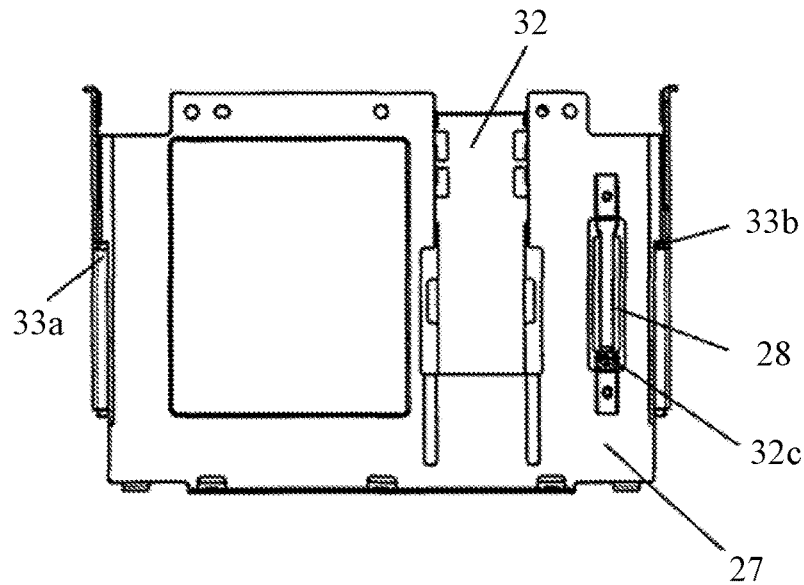
FIGS. 18A to 18C are explanatory diagrams of an operation of a slide mechanism (Embodiment 2).
Figure 18C:
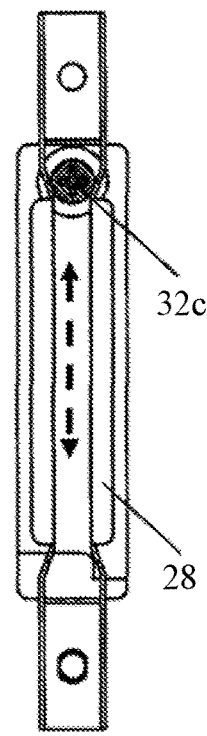
Figure 18B:
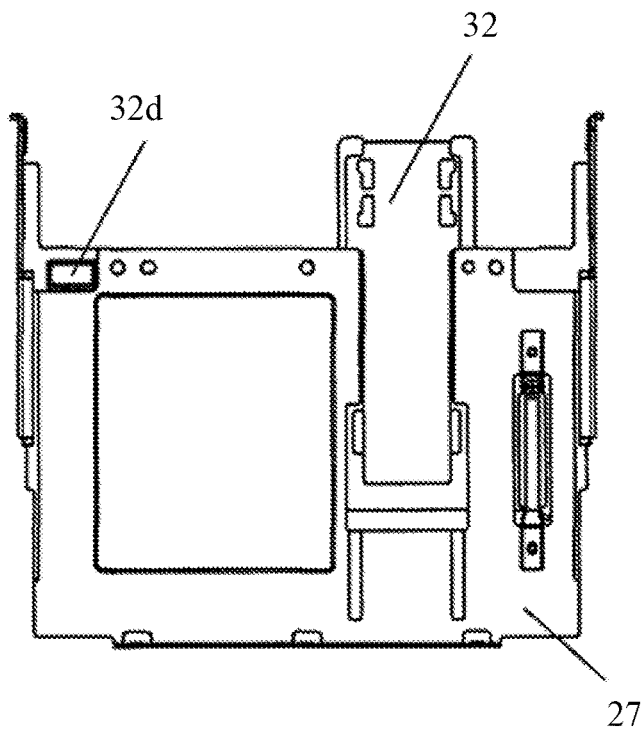
Figure 19:
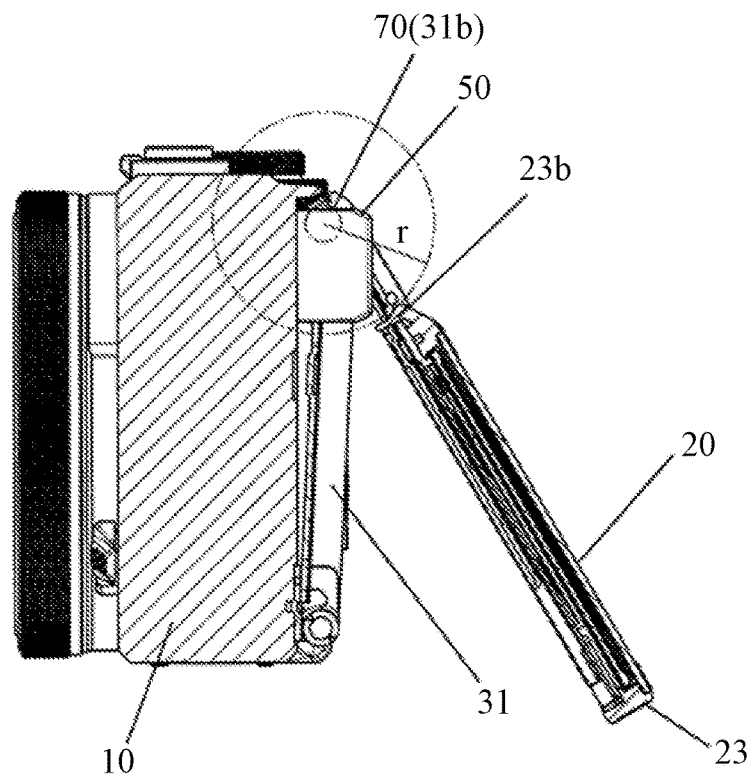
FIG. 19 is a sectional view showing a rotation trajectory of the display apparatus (Embodiment 2).

Next, referring to FIGS. 18A to 18C and 19, a description will be given of a sliding mechanism. FIGS. 18A to 18C are explanatory diagrams of a sliding operation of the slide plate 27 with respect to the arm plate 32. FIG. 19 is a sectional view showing a rotation trajectory of the display apparatus 20 with respect to the electronic viewfinder 50 when the display apparatus 20 tilts while sliding. FIG. 18(a) illustrates a state in which the display apparatus 20 is located at the housing position. FIG. 18(b) illustrates a state in which the display apparatus 20 slides downward (the state of FIG. 17(a)). FIG. 18(c) is an enlarged view of the click plate 28 and the slid pin 32c when the display apparatus 20 slides downward.

In FIG. 18A, as the display apparatus 20 is located at the housing position, the slide plate 27 is stopped at the housing position. At this time, the click plate 28 and the slide pin 32c are charged, and a force which urges the slide plate 27 upward is generated. As a result, the cover member 23 abuts against an end surface (not illustrated) of the arm plate 32 to stop, and an urging force toward the housing position is generated.

In FIG. 18B, as the display apparatus 20 is located at the sliding position, the slide plate 27 is stopped at the position sliding downward with respect to the imaging apparatus body 10. At this time, a force to urge the slide plate 27 downward is generated. As a result, the cover member 23 abuts against the end surface (not illustrated) of the arm plate 32 to stop, and an urging force toward the sliding position is generated.

As illustrated in FIG. 18C, the click plate 28 and the slide pin 32c are formed in a plate spring shape, and urge in a retracting direction at both the housing position and the sliding position by the plate spring shape. At a position in the middle of the sliding operation, the click plate 28 is deformed to generate a frictional force on the slide pin 32c so that a proper load is generated.

As illustrated in FIG. 19, the display apparatus 20 tilts upward from the sliding position around a rotation center 70. An end part 23b of the cover member 23 is configured to draw a trajectory of a state in which a clearance is secured not to contact the electronic viewfinder 50 protruding to the back from the imaging apparatus body 10 when the display apparatus 20 tilts. The distance r from the rotation center 70 to the end part 23b (slide quantity of the display apparatus 20) is set by the protrusion quantity of the electronic viewfinder 50. At this time, as setting large slide quantity carelessly cannot secure a strength when an external force is applied to the display apparatus 20, the distance r should be set to a minimum necessary clearance which prevents the display apparatus 20 from contacting the electronic viewfinder 50.

At the stop position of the slide plate 27 in FIG. 18B, the display apparatus 20 secures a proper clearance with the electronic viewfinder 50, and thereby an unexpected collision with the electronic viewfinder 50 by the slide of the display apparatus 20 due to the urging force of the click plate 28 can be prevented.

Figures 20A, 20B:
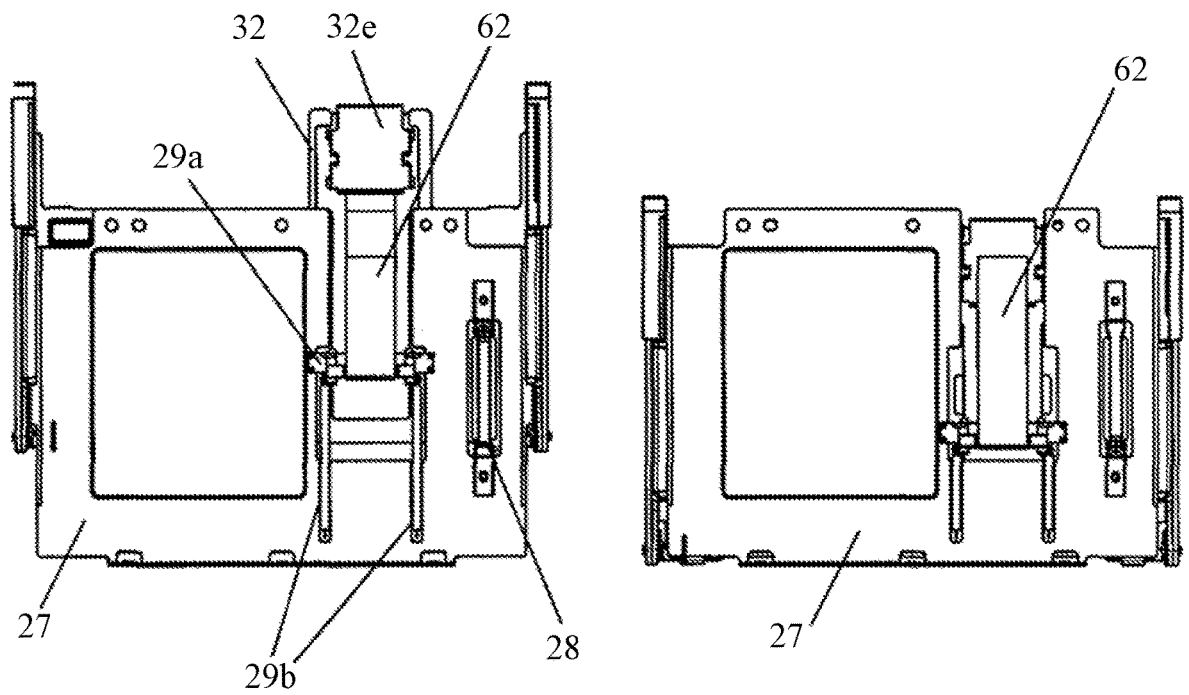
FIGS. 20A and 20B are explanatory diagrams of an operation of a slider mechanism (Embodiment 2).
Figure 21A:
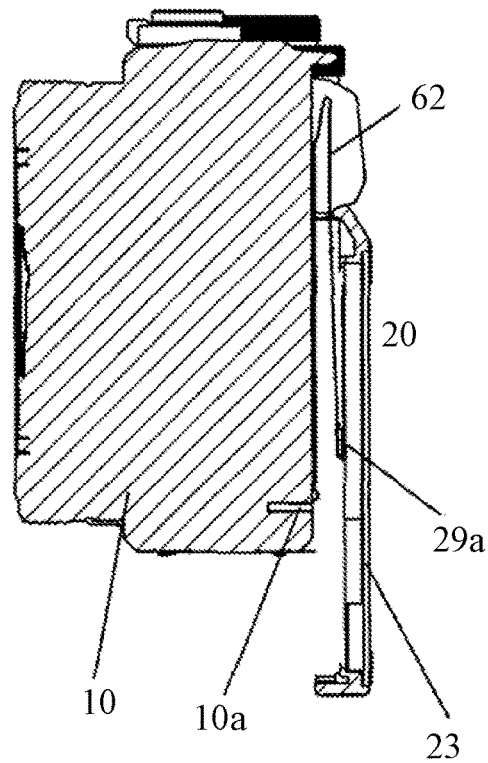
FIGS. 21A and 21B are sectional views of the slider mechanism (Embodiment 2).
Figure 21B:
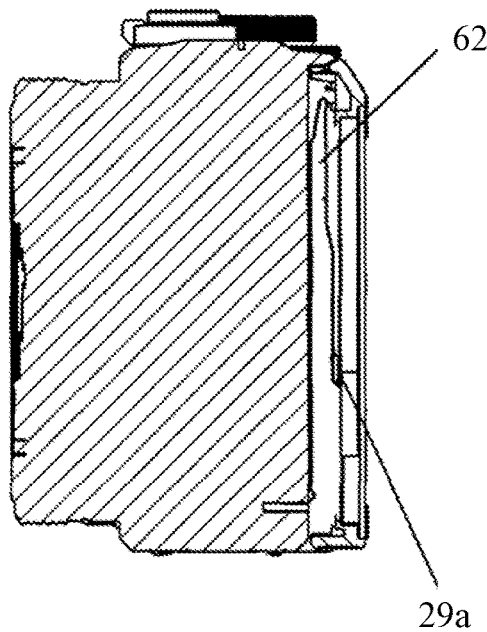

Next, referring to FIGS. 20A, 20B, 21A and 21B, a description will be given of the slider mechanism 29 for suppressing a sag of the flexible printed substrate 62 when the display apparatus 20 slides. FIGS. 20A and 20B are explanatory diagrams of an operation of the slider mechanism 29. FIGS. 21A and 21B are sectional views of the slider mechanism 29.

FIG. 20A illustrates an internal state in which the display apparatus 20 slides. A slider (sliding member) 29a, which is included in the slider mechanism 29, contacts the flexible printed substrate 62 to be sandwiched by the flexible printed substrate 62 and is urged downward by two tension springs 29b. The slider 29a is held vertically slidably in the display apparatus 20. In the state of FIG. 20A, the tension springs 29b are in the most extended state. The flexible printed substrate 62 is pulled downward through the slider 29a and stops. In the state of FIG. 20A, the tension applied to the flexible printed substrate 62 is the largest, and the slider 29a is in the state of being moved to the top in the display apparatus 20.

FIG. 20B illustrates an internal state in which the display apparatus 20 is located at the housing position. In the state of FIG. 20B, the tension springs 29b is in the most contracted state. The flexible printed substrate 62 is pulled downward through the slider 29a and stops. In the state of FIG. 20B, the tension applied to the flexible printed substrate 62 is the smallest, and the slider 29a is moved to the lowermost position in the display apparatus 20.

FIG. 21A illustrates a state in which the display apparatus 20 is positioned at the slide position. The flexible printed substrate 62 continuing from the inside of the display apparatus 20 extends downward, and is then folded upward while in contact with the slider 29a. The flexible printed substrate 62 extending upward along the arm plate 32 is folded backward again. The flexible printed substrate 62 is inserted inside the imaging apparatus 1 from an opening 10a of the imaging apparatus body 10 after extending downward further, and is connected to the main substrate (electronic substrate) (not illustrated). In FIG. 21A, the flexible printed substrate 62 stops at a folded part contacting the slider 29a while being pulled downward. At this time, the urging force of the tension springs 29b is the largest.

FIG. 21B illustrates a state in which the display apparatus 20 is located at the housing position. In this state, the flexible printed substrate 62 is folded back as in the case of FIG. 21A and is inserted into the inside of the imaging apparatus body 10. As the position of the slider 29a moves upward, the urging force by the tension springs 29b becomes the smallest.

Figure 22A:
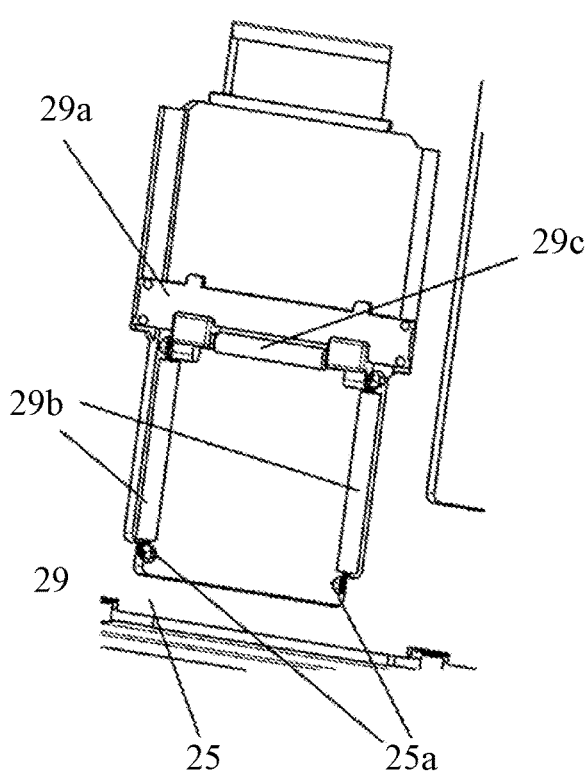
FIGS. 22A and 22B are explanatory diagrams of a configuration of the slider mechanism (Embodiment 2).
Figure 22B:
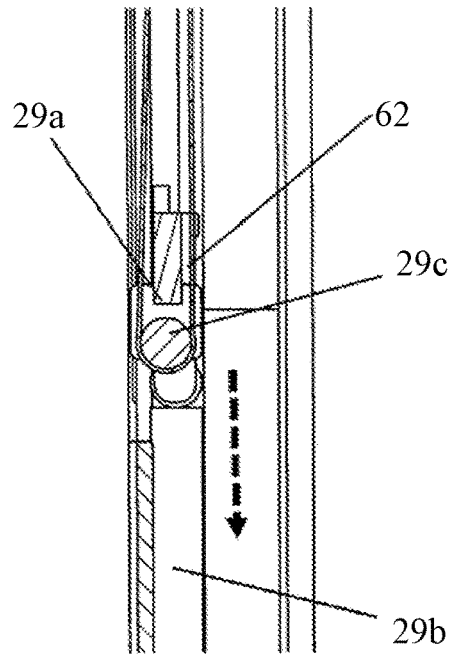

Next, referring to FIGS. 22A and 22B, a description will be given of a case where a rotation roller is added to the slider mechanism 29. FIGS. 22A and 22B are explanatory diagrams of a configuration of the slider mechanism 29.

As illustrated in FIG. 22A, the slider 29a is held vertically slidably with respect to the spacer 25. First and second ends of each of the tension springs 29b are respectively locked to a claw part 25a of the spacer 25 and the slider 29a. As a result, the slider 29a is held vertically slidably in the display apparatus 20 and is urged downward by the tension springs 29b.

FIG. 22B illustrates a cross-sectional view for explaining an internal configuration of the slider mechanism 29. A rotation roller 29c is disposed in a center of the slider 29a to be in contact with an inner peripheral surface of the folded flexible printed substrate 62. The rotation roller 29c is held rotatably with respect to the slider 29a, and rotates by frictional resistance with the flexible printed substrate 62 when the display apparatus 20 slides.

When the slider 29a moves up and down while the display apparatus 20 slides, a sliding load applied to the flexible printed substrate 62 can be reduced by rotating the rotation roller 29c. As a result, damage to the flexible printed substrate 62 can be reduced, and problems such as disconnection of internal wiring can be prevented.

As described above, the slider mechanism 29 can prevent the flexible printed substrate 62 from sagging when sliding the display apparatus 20, and can also prevent problems such as disconnection of the wiring due to the sliding load.

As described above, sliding the display apparatus 20 without moving the hinge apparatus (rotation center of the tilt) can prevent the interference with the electronic viewfinder 50, which protrudes the back surface, when tilting by 180 degrees upward. Additionally, providing a retraction mechanism inside the display apparatus 20 can stop the display apparatus 20 by reliably drawing into each of the housing position and the slide position. Furthermore, providing the slider mechanism 29 of the flexible printed substrate 62 in the display apparatus 20 can prevent the sag and disconnection of the flexible printed substrate 62 during the sliding.

In this embodiment, the electronic viewfinder 50 is protruded manually, but the present invention is not limited to this. The electronic viewfinder 50 may be protruded in conjunction with the slide operation of the display apparatus 20 or may be protruded by operating a lever or an operation button provided separately.

Further, in this embodiment, the electronic viewfinder 50 is exposed from an area generated by sliding the display apparatus 20, but the present invention is not limited to this. An optical finder or other apparatus may be exposed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electronic apparatus comprising:
   a main body unit;
   a first display unit; and
   a second display unit,
   wherein the first display unit is slidable with respect to the main body unit,
   wherein when the main body unit and the first display unit are overlapped, the main body unit houses the second display unit in an area where the main body unit and the first display unit are overlapped, and
   wherein the second display unit moves to an area where the first display unit does not exist by a slide of the first display unit with respect to the main body unit, and protrudes from an inside of the main body unit,
   wherein when tilting with respect to the main body unit to come close to the second display unit which protrudes from the inside of the main body unit after the slide with respect to the main body unit, the first display unit does not come into contact with the second display unit.

2. The electronic apparatus according to claim 1, wherein the second display unit moves to the area where the first display unit does not exist by the slide of the first display unit with respect to the main body unit in conjunction with the slide of the first display unit with respect to the main body unit, and protrudes from the inside of the main body unit.

3. The electronic apparatus according to claim 1, wherein when tilting with respect to the main body unit to come close to the second display unit which protrudes from the inside of the main body unit after the slide with respect to the main body unit, the first display unit abuts against the main body unit before coming into contact with the second display unit.

4. The electronic apparatus according to claim 1, wherein when tilting with respect to the main body unit to come close to the second display unit which protrudes from the inside of the main body unit after the slide with respect to the main body unit, the first display unit is engaged not to come into contact with the second display unit.

5. The electronic apparatus according to claim 4, further comprising a coupling unit that couples the main body unit and the first display unit,
   wherein the first display unit is tiltable and slidable with respect to the main body unit through the coupling unit, and
   wherein a slide quantity of the first display unit with respect to the coupling unit is set to prevent the first display unit from coming into contact with the second display unit protruding the inside of the main body unit when the first display unit tilts.

6. The electronic apparatus according to claim 5,
   wherein the coupling unit includes a first hinge member held by the main body unit and a second hinge member rotatably held by the first hinge member, and
   wherein the first display unit is slidably held by the second hinge member.

7. The electronic apparatus according to claim 6, wherein the first hinge member is tiltable with respect to the main body unit.

8. The electronic apparatus according to claim 6,
   wherein the first display unit includes a first urging member,
   wherein the second hinge member includes a second urging member, and
   wherein the first and second urging members urge the first display unit to stop at a position housed in the main body unit and a position after the slide.

9. The electronic apparatus according to claim 5, further comprising:
   a flexible printed substrate that connects the first display unit to an electronic substrate provided inside the main body unit;
   a second sliding member that connects the flexible printed substrate and is slidably held inside the first display unit; and
   a third urging member that urges the second sliding member in a predetermined direction,
   wherein the flexible printed substrate is arranged so that tension is added in the predetermined direction by the second sliding member, and wherein the tension is added to the flexible printed substrate while the first display unit moves between a position housed in the main body unit and a position after the slide.

10. The electronic apparatus according to claim 1, further comprising a coupling unit that couples the main body unit and the first display unit,
wherein the first display unit is tiltable and slidable with respect to the main body unit through the coupling unit,
wherein at least one of the main body unit and the coupling unit is provided with a regulating member, and
wherein when the first display unit after the slide tilts, the regulating member abuts against the first display unit before the first display unit comes into contact the second display unit.

11. The electronic apparatus according to claim 10,
wherein the main body unit includes a first detector that stops a display of the first display unit and starts a display of the second display unit by detecting a magnetic flux larger than a first predetermined value, and
wherein when the first display unit slides from a housing position by a distance larger than a predetermined quantity, the first detector detects the magnetic flux larger than the first predetermined value with a magnet provided in the first display unit.

12. The electronic apparatus according to claim 10, wherein the regulating member is a protruding member that protrudes from a back side of the main body unit.

13. The electronic apparatus according to claim 10,
wherein the first display unit includes a protector that covers a circumference of the first display to protect the first display unit, and
wherein the protector includes an abutting member that abuts against the regulating member when the first display unit after the slide tilts.

14. The electronic apparatus according to claim 10, wherein when the first display unit after the slide tilts so that the regulating member abuts against the first display unit, a lowermost surface of the first display unit is located above a bottom surface of the main body unit.

15. The electronic apparatus according to claim 10,
wherein the main body unit includes an engaging member and an urging member that urges the engaging member,
wherein the first display unit includes a magnet,
wherein when the first display unit tilts by an angle smaller than a first angle downward, or tilts by an angle smaller than a second angle upward, the engaging member moves to a side of the first display unit by an attractive force of the magnet, and
wherein when the first display unit tilts by an angle larger than the first angle downward, or tilts by an angle larger than the second angle upward, the engaging member moves to a side of the main body unit by an urging force of the urging member opposite to the attractive force of the magnet.

16. The electronic apparatus according to claim 15, wherein when the first display unit does not tilt, the engaging member moves to the side of the first display unit by the attractive force of the magnet.

17. The electronic apparatus according to claim 15,
wherein the coupling unit includes a first sliding member that is held by the first display unit and slides with the first display unit, and
wherein the engaging member engages with the first sliding member to slide with the first display unit while moving to the side of the first display unit by the attractive force of the magnet.

18. The electronic apparatus according to claim 10,
wherein the main body unit includes a second detector that changes orientation of a display image of the first display unit by detecting a magnetic flux larger than a second predetermined value, and
wherein when the first display unit tilts by an angle larger than a third angle, the second detector detects the magnetic flux larger than the second predetermined value by a magnet provided in the first display unit.

* * * * *